US008488325B1

(12) United States Patent
Yu

(10) Patent No.: US 8,488,325 B1
(45) Date of Patent: *Jul. 16, 2013

(54) MEMORY MODULE HAVING THERMAL CONDUITS

(75) Inventor: Enchao Yu, Irvine, CA (US)

(73) Assignee: Netlist, Inc., Irvine, CA (US)

(*) Notice: Subject to any disclaimer, the term of this patent is extended or adjusted under 35 U.S.C. 154(b) by 41 days.

This patent is subject to a terminal disclaimer.

(21) Appl. No.: 12/916,945

(22) Filed: Nov. 1, 2010

Related U.S. Application Data

(63) Continuation of application No. 12/617,665, filed on Nov. 12, 2009, now Pat. No. 7,839,643, which is a continuation of application No. 11/707,625, filed on Feb. 16, 2007, now Pat. No. 7,619,893.

(60) Provisional application No. 60/774,397, filed on Feb. 17, 2006, provisional application No. 60/811,138, filed on Jun. 5, 2006.

(51) Int. Cl.
H05K 7/20 (2006.01)
F28F 7/00 (2006.01)
H01L 23/26 (2006.01)
H01L 23/34 (2006.01)

(52) U.S. Cl.
USPC ........... 361/715; 361/704; 361/710; 361/719; 165/80.2; 174/16.3; 257/719

(58) Field of Classification Search
USPC 361/704, 709–711, 715, 719; 165/80.3–80.5, 165/185; 174/16.1, 16.3; 257/713, 718–719
See application file for complete search history.

(56) References Cited

U.S. PATENT DOCUMENTS

| 3,268,772 | A | | 8/1966 | Kamei et al. |
| 3,893,161 | A | | 7/1975 | Pesak et al. |
| 4,535,385 | A | | 8/1985 | August et al. |
| 4,628,407 | A | | 12/1986 | August et al. |
| 4,849,858 | A | | 7/1989 | Grapes et al. |
| 4,867,235 | A | | 9/1989 | Grapes et al. |
| 4,872,505 | A | | 10/1989 | Jones et al. |
| 4,887,353 | A | | 12/1989 | Preputnick |
| 5,060,113 | A | | 10/1991 | Jacobs |
| 5,109,318 | A | * | 4/1992 | Funari et al. .................. 361/710 |
| 5,229,916 | A | | 7/1993 | Frankeny et al. |

(Continued)

FOREIGN PATENT DOCUMENTS

| JP | 05-335695 | 12/1993 |
| JP | 2821315 | 11/1998 |

(Continued)

OTHER PUBLICATIONS

Shawn Hall et al., "Low-Cost, High Performance Heatsinks for Closely Spaced DIMMs," presentation to JEDEC, Dec. 5, 2006.

Primary Examiner — Zachary M Pape
(74) Attorney, Agent, or Firm — Jamie J. Zheng, Esq.

(57) ABSTRACT

A memory module is provided having a plurality of integrated circuit packages. The memory module includes a first thermal conduit in thermal communication with a first set of integrated circuit packages on the first side, and substantially thermally isolated from a second set of one or more integrated circuit packages on the first side. The memory module further includes a second thermal conduit in thermal communication with the set of one or more integrated circuit packages.

24 Claims, 38 Drawing Sheets

U.S. PATENT DOCUMENTS

| | | | |
|---|---|---|---|
| 5,244,023 A | 9/1993 | Spies | |
| 5,313,097 A | 5/1994 | Haj-Ali-Ahmadi et al. | |
| 5,343,359 A | 8/1994 | Morton et al. | |
| 5,432,913 A | 7/1995 | Smits et al. | |
| 5,445,869 A | 8/1995 | Ishikawa et al. | |
| 5,513,135 A | 4/1996 | Dell et al. | |
| 5,731,633 A | 3/1998 | Clayton | |
| 5,739,687 A | 4/1998 | Hanley | |
| 5,751,553 A | 5/1998 | Clayton | |
| 5,754,409 A | 5/1998 | Smith | |
| 5,784,263 A | 7/1998 | Nelson | |
| 5,812,374 A | 9/1998 | Shuff | |
| 5,892,658 A | 4/1999 | Urda et al. | |
| 5,901,781 A | 5/1999 | Arai et al. | |
| 5,949,650 A | 9/1999 | Bulante et al. | |
| 5,949,657 A | 9/1999 | Karabatsos | |
| 5,966,287 A | 10/1999 | Lofland et al. | |
| 5,986,887 A | 11/1999 | Smith et al. | |
| 6,021,048 A | 2/2000 | Smith | |
| 6,025,992 A | 2/2000 | Dodge et al. | |
| 6,049,975 A | 4/2000 | Clayton | |
| 6,064,575 A | 5/2000 | Urda et al. | |
| 6,091,145 A | 7/2000 | Clayton | |
| 6,104,613 A | 8/2000 | Urda et al. | |
| 6,151,215 A | 11/2000 | Hoffman | |
| 6,157,541 A | 12/2000 | Hacke | |
| 6,173,382 B1 | 1/2001 | Dell et al. | |
| 6,180,881 B1 | 1/2001 | Isaak | |
| 6,201,700 B1 | 3/2001 | Tzimares et al. | |
| 6,208,517 B1 | 3/2001 | Prince et al. | |
| 6,222,739 B1 | 4/2001 | Bhakta et al. | |
| 6,232,659 B1 | 5/2001 | Clayton | |
| 6,297,960 B1 | 10/2001 | Moden et al. | |
| 6,377,460 B1 * | 4/2002 | Pohl et al. | 361/704 |
| 6,381,140 B1 | 4/2002 | Liao | |
| 6,392,305 B1 | 5/2002 | Huang et al. | |
| 6,423,909 B1 | 7/2002 | Haynie et al. | |
| 6,424,532 B2 | 7/2002 | Kawamura | |
| 6,444,921 B1 | 9/2002 | Wang et al. | |
| 6,449,159 B1 | 9/2002 | Haba | |
| 6,507,912 B1 | 1/2003 | Matyas, Jr. et al. | |
| 6,510,100 B2 | 1/2003 | Grundon et al. | |
| 6,525,943 B2 | 2/2003 | Moden et al. | |
| 6,535,387 B2 * | 3/2003 | Summers et al. | 361/704 |
| 6,576,992 B1 | 6/2003 | Cady et al. | |
| 6,590,282 B1 | 7/2003 | Wang et al. | |
| 6,713,854 B1 | 3/2004 | Kledzik et al. | |
| 6,740,821 B1 | 5/2004 | Jiang et al. | |
| 6,757,751 B1 | 6/2004 | Gene | |
| 6,760,224 B2 | 7/2004 | Moden et al. | |
| 6,762,942 B1 | 7/2004 | Smith | |
| 6,765,797 B2 | 7/2004 | Summers et al. | |
| 6,833,984 B1 | 12/2004 | Belgacem | |
| 6,956,284 B2 | 10/2005 | Cady et al. | |
| 7,023,701 B2 | 4/2006 | Stocken et al. | |
| 7,053,478 B2 | 5/2006 | Roper et al. | |
| 7,079,396 B2 | 7/2006 | Gates et al. | |
| 7,094,632 B2 | 8/2006 | Cady et al. | |
| 7,106,595 B2 | 9/2006 | Foster et al. | |
| 7,181,167 B2 | 2/2007 | Onggosanusi et al. | |
| 7,254,036 B2 | 8/2007 | Pauley et al. | |
| 7,289,327 B2 | 10/2007 | Goodwin et al. | |
| 7,304,842 B2 | 12/2007 | Yatskov | |
| 7,375,970 B2 | 5/2008 | Pauley et al. | |
| 7,400,506 B2 | 7/2008 | Hoss et al. | |
| 7,474,529 B2 | 1/2009 | Tian et al. | |
| 7,477,520 B2 * | 1/2009 | Shibamoto et al. | 361/719 |
| 7,619,893 B1 | 11/2009 | Yu | |
| 7,630,202 B2 | 12/2009 | Pauley et al. | |
| 2002/0076959 A1 | 6/2002 | Lee | |
| 2002/0125039 A1 | 9/2002 | Marketkar et al. | |
| 2003/0116835 A1 | 6/2003 | Miyamoto et al. | |
| 2003/0234443 A1 | 12/2003 | Partridge et al. | |
| 2004/0218367 A1 | 11/2004 | Lin et al. | |
| 2004/0229402 A1 | 11/2004 | Cady et al. | |
| 2004/0236877 A1 * | 11/2004 | Burton | 710/22 |
| 2004/0262737 A1 | 12/2004 | Haba | |
| 2005/0018412 A1 | 1/2005 | Roper et al. | |
| 2005/0047776 A1 | 3/2005 | Watanabe et al. | |
| 2005/0057911 A1 | 3/2005 | Rapport et al. | |
| 2005/0078457 A1 | 4/2005 | Hsieh et al. | |
| 2005/0146031 A1 | 7/2005 | Partridge et al. | |
| 2005/0242423 A1 | 11/2005 | Partridge et al. | |
| 2005/0259504 A1 | 11/2005 | Murtugh et al. | |
| 2005/0263911 A1 | 12/2005 | Igarashi et al. | |
| 2005/0289287 A1 | 12/2005 | Shin et al. | |
| 2006/0020740 A1 | 1/2006 | Bartley et al. | |
| 2006/0048385 A1 | 3/2006 | Cady et al. | |
| 2006/0049500 A1 | 3/2006 | Goodwin | |
| 2006/0049502 A1 | 3/2006 | Goodwin et al. | |
| 2006/0049512 A1 | 3/2006 | Goodwin | |
| 2006/0049513 A1 | 3/2006 | Goodwin | |
| 2006/0050488 A1 | 3/2006 | Goodwin | |
| 2006/0050489 A1 | 3/2006 | Wehrly, Jr. et al. | |
| 2006/0050492 A1 | 3/2006 | Goodwin et al. | |
| 2006/0050496 A1 | 3/2006 | Goodwin | |
| 2006/0050497 A1 | 3/2006 | Goodwin | |
| 2006/0050498 A1 | 3/2006 | Cady et al. | |
| 2006/0050592 A1 | 3/2006 | Cady et al. | |
| 2006/0053345 A1 | 3/2006 | Goodwin | |
| 2006/0083043 A1 | 4/2006 | Cypher | |
| 2006/0090102 A1 | 4/2006 | Wehrly, Jr. et al. | |
| 2006/0090119 A1 | 4/2006 | Dong et al. | |
| 2006/0091529 A1 | 5/2006 | Wehrly, Jr. et al. | |
| 2006/0095592 A1 | 5/2006 | Borkenhagen | |
| 2006/0111866 A1 | 5/2006 | LeClerg et al. | |
| 2006/0125067 A1 | 6/2006 | Wehrly, Jr. et al. | |
| 2006/0129888 A1 | 6/2006 | Szewerenko et al. | |
| 2006/0198238 A1 | 9/2006 | Partridge et al. | |
| 2006/0203442 A1 | 9/2006 | Goodwin | |
| 2006/0250780 A1 | 11/2006 | Goodwin | |
| 2006/0261449 A1 | 11/2006 | Rapport et al. | |
| 2007/0111606 A1 | 5/2007 | Goodwin | |
| 2007/0115017 A1 | 5/2007 | Goodwin et al. | |
| 2007/0126124 A1 | 6/2007 | Rapport et al. | |
| 2007/0126125 A1 | 6/2007 | Rapport et al. | |
| 2007/0139897 A1 | 6/2007 | RaghuRam | |
| 2007/0201208 A1 | 8/2007 | Goodwin et al. | |
| 2008/0116571 A1 | 5/2008 | Dang | |
| 2008/0123300 A1 | 5/2008 | Tian | |
| 2010/0110642 A1 | 5/2010 | Pauley et al. | |

FOREIGN PATENT DOCUMENTS

| | | |
|---|---|---|
| JP | 2001077294 | 3/2001 |
| JP | 2003086760 | 3/2003 |
| JP | 2003086761 | 3/2003 |

* cited by examiner

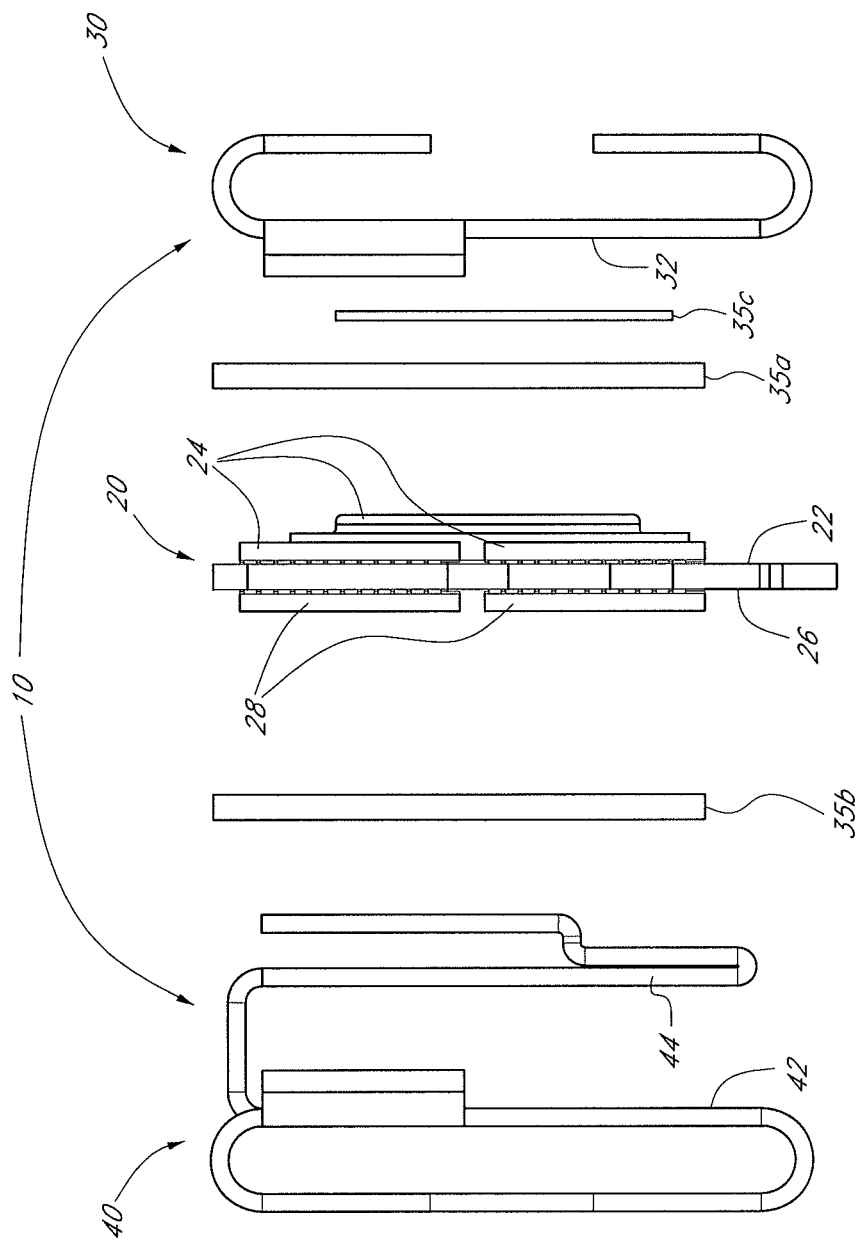

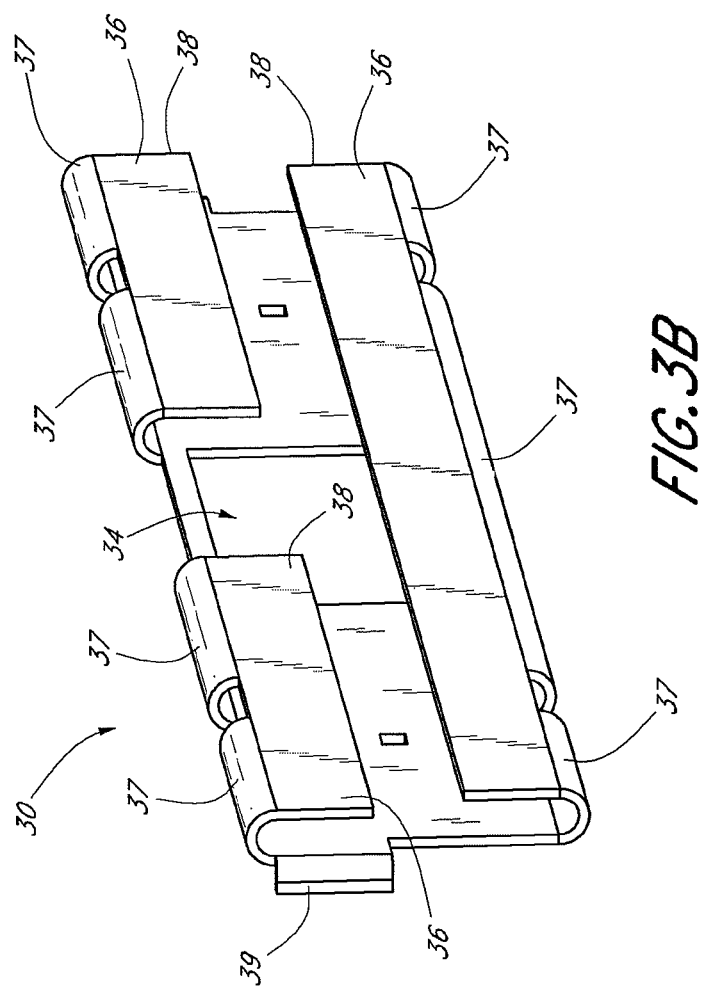

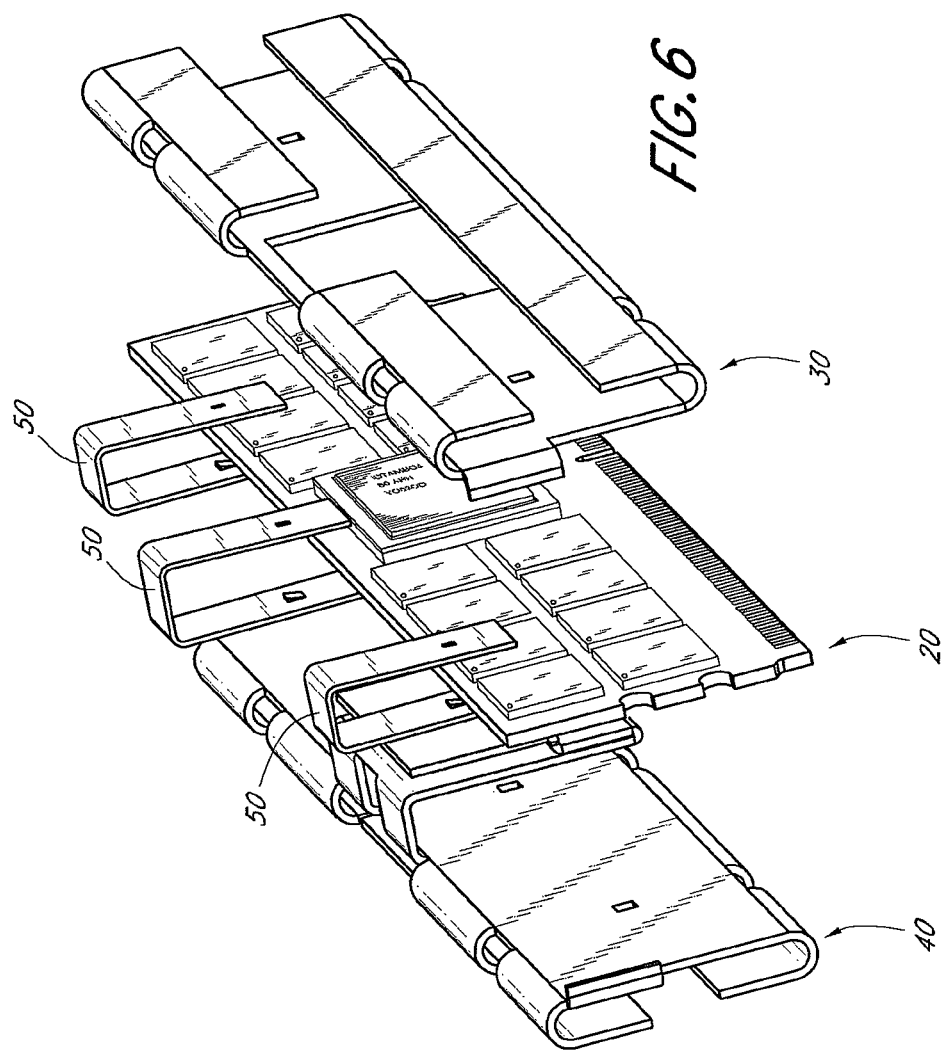

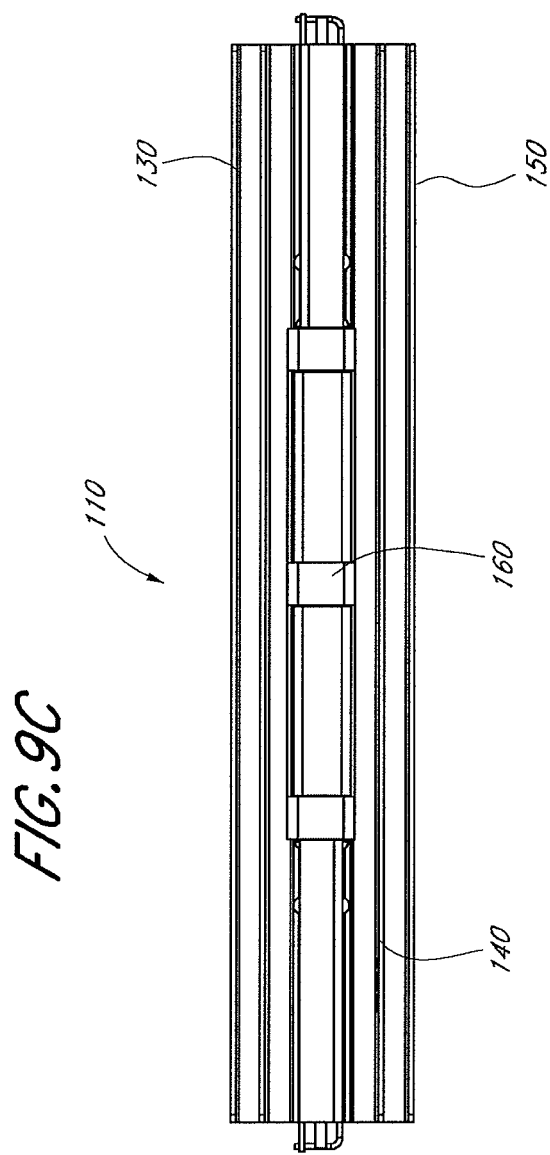
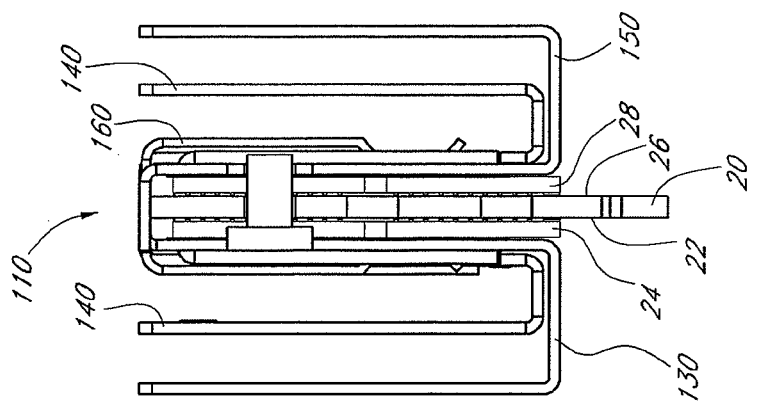

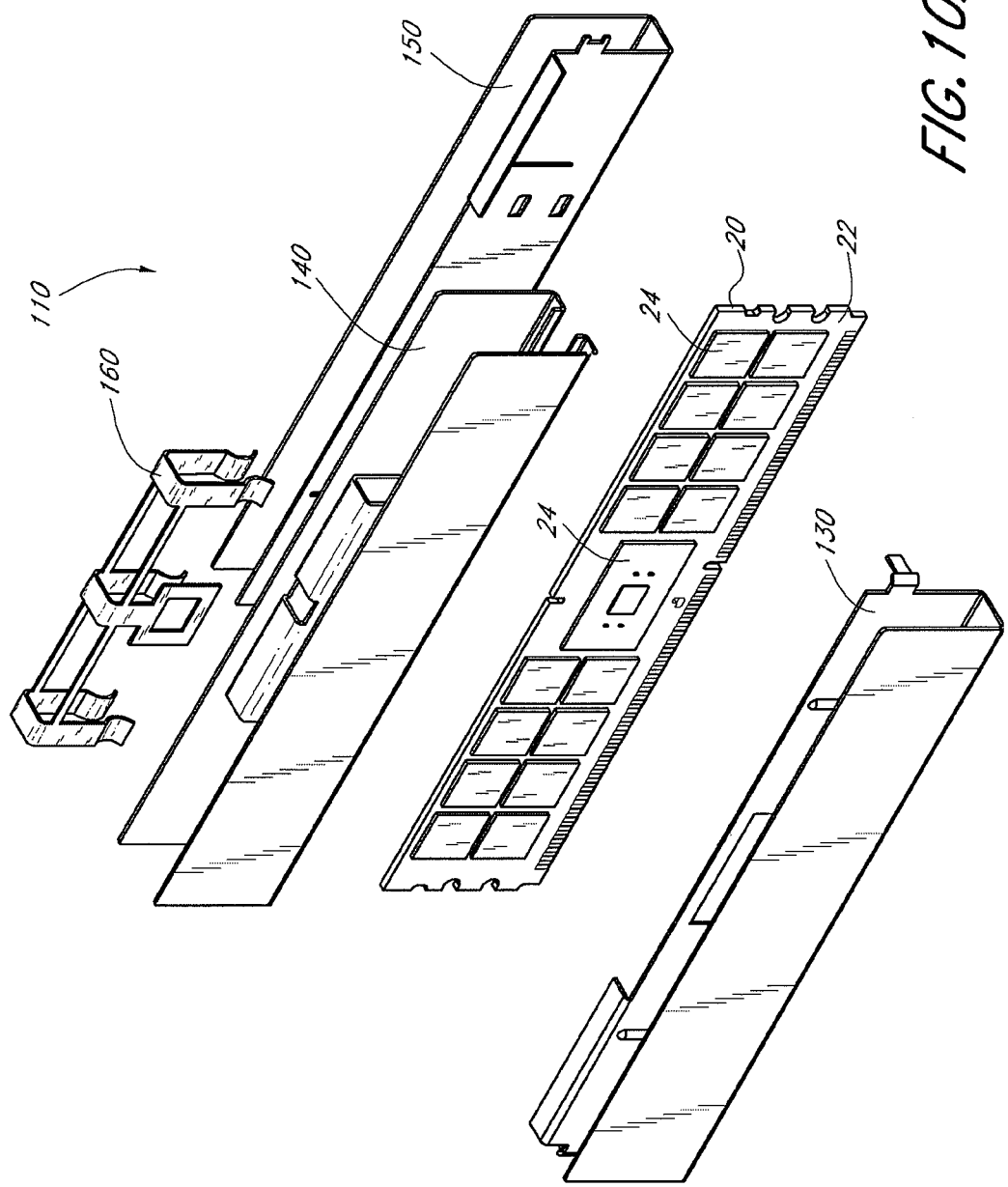

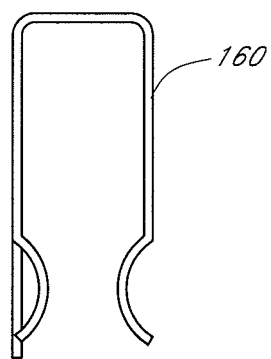
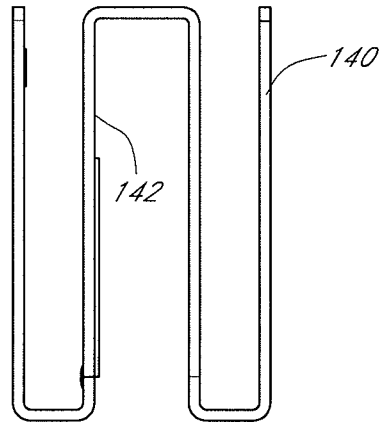
FIG.10B
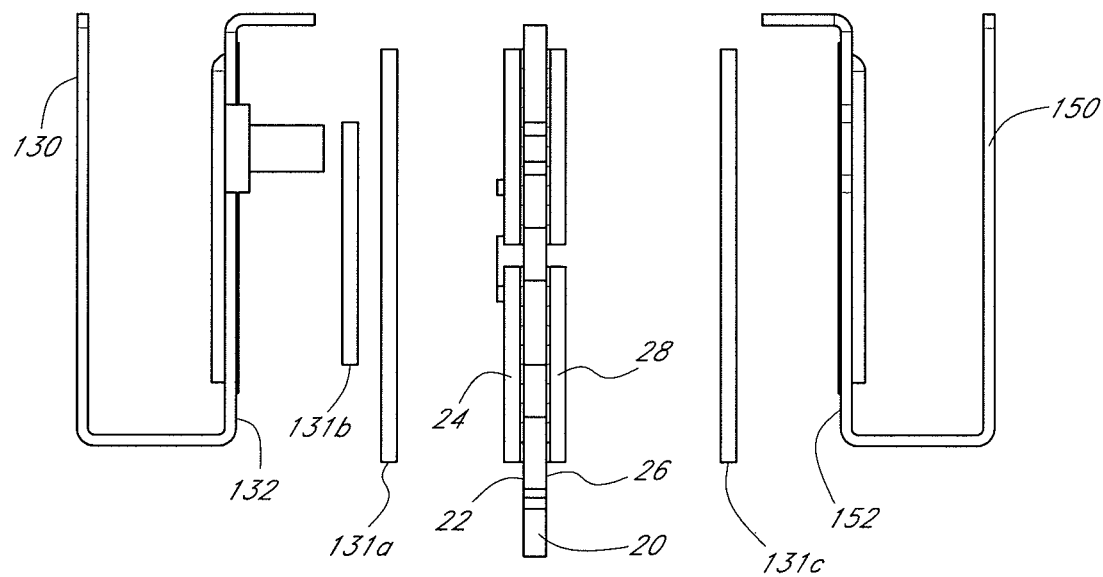

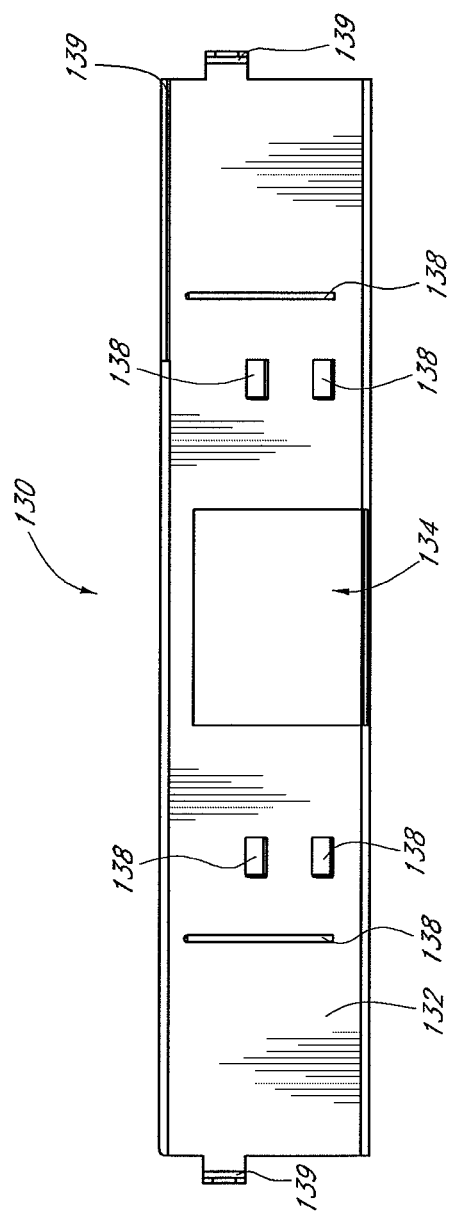

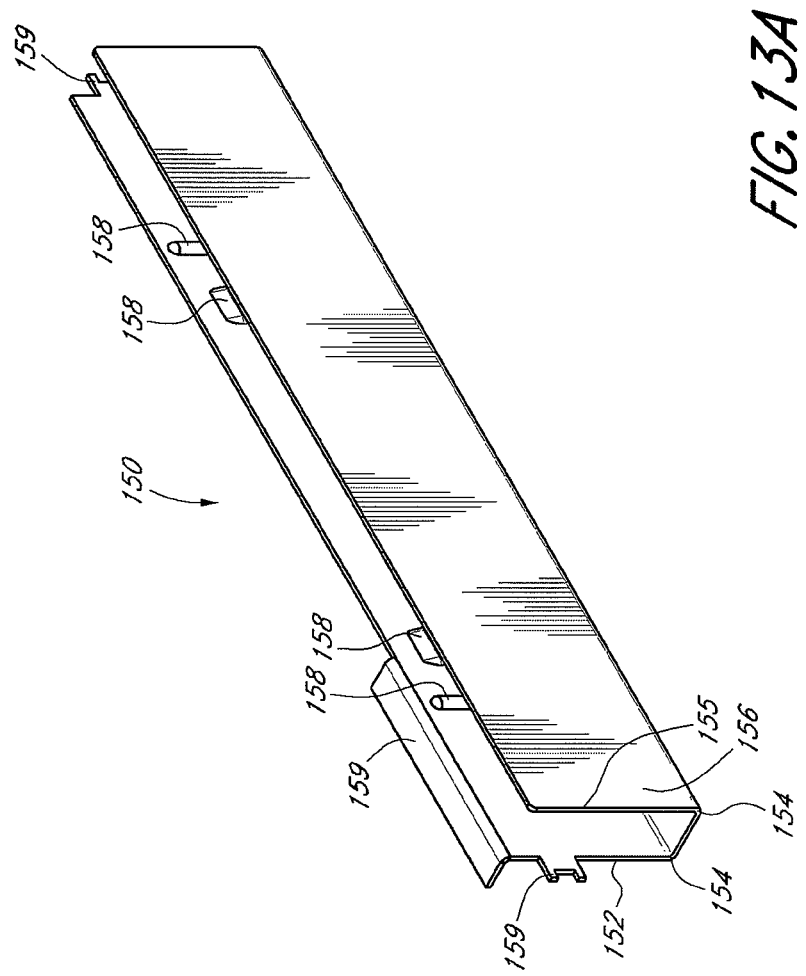

MEMORY MODULE HAVING THERMAL CONDUITS

CLAIM OF PRIORITY

This application is a continuation from U.S. patent application Ser. No. 12/617,665, filed Nov. 12, 2009, incorporated in its entirety by reference herein, which is a continuation from U.S. patent application Ser. No. 11/707,625, filed Feb. 16, 2007, incorporated in its entirety by reference herein, and which claims priority to U.S. Provisional Pat. Appl. No. 60/774,397, filed Feb. 17, 2006, and U.S. Provisional Pat. Appl. No. 60/811,138, filed Jun. 5, 2006, each of which is incorporated in its entirety by reference herein.

BACKGROUND OF THE INVENTION

1. Field of the Invention

This invention relates generally to heat spreaders for electronic modules.

2. Description of the Related Art

High density electronic modules (e.g., memory modules) dissipate a significant amount of heat which may degrade performance of the modules in end-use applications. Typically, heat spreaders made of conductive metal, such as copper or aluminum, are used to distribute the dissipated heat across the surface of the module, which is cooled by the system ventilation.

SUMMARY OF THE INVENTION

In certain embodiments, a heat spreader is provided for use with an electronic module. The electronic module has a first side with a first plurality of electronic components mounted thereon and a second side with a second plurality of electronic components mounted thereon. The heat spreader comprises a first segment mountable on the module to be in thermal communication with at least one electronic component mounted on the first side, and to be substantially thermally isolated from at least one electronic component mounted on the first side. The heat spreader further comprises a second segment mountable on the module to be in thermal communication with the at least one electronic component mounted on the first side that is substantially thermally isolated from the first segment.

In certain embodiments, a heat spreader is provided for use with an electronic module. The electronic module has a first side with a first plurality of electronic components mounted thereon and a second side with a second plurality of electronic components mounted thereon. The heat spreader comprises a heat spreader segment mountable on the module to be in thermal communication with at least one electronic component mounted on the first side, to be substantially thermally isolated from at least one electronic component mounted on the first side, and to be in thermal communication with at least one electronic component mounted on the second side.

In certain embodiments, a method is provided for thermally coupling a heat spreader to an electronic module. The electronic module has a first side with a first plurality of electronic components mounted thereon and a second side with a second plurality of electronic components mounted thereon. The method comprises mounting a first segment of the heat spreader on the module to be in thermal communication with at least one electronic component mounted on the first side and to be substantially thermally isolated from at least one electronic component mounted on the first side. The method further comprises mounting a second segment of the heat spreader on the module to be in thermal communication with the at least one electronic component mounted on the first side that is substantially thermally isolated from the first segment.

In certain embodiments, a heat spreader is provided for use with an electronic module having a first side with a first plurality of electronic components mounted thereon. The heat spreader comprises a first segment comprising a first portion mountable to be in thermal communication with at least one electronic component of the first plurality of electronic components. The first segment further comprises a second portion extending generally away from the first portion. The second portion comprises a surface extending generally parallel to the first portion. The first portion and the second portion generally define a region therebetween through which air can flow to cool the module.

BRIEF DESCRIPTION OF THE DRAWINGS

FIGS. 1A-1C schematically illustrate exploded views from various angles of an example heat spreader compatible with certain embodiments described herein.

FIGS. 3A-3C schematically illustrate various views of an example first segment of the heat spreader compatible with certain embodiments described herein.

FIG. 6 schematically illustrates an exploded view of one example configuration of fasteners with the first segment, the second segment, and the module in accordance with certain embodiments described herein.

FIGS. 9A-9C schematically illustrate another example heat spreader comprising a first segment, a second segment, and a third segment in accordance with certain embodiments described herein.

FIGS. 10A and 10B schematically illustrate exploded views of the example heat spreader of FIGS. 9A-9C in accordance with certain embodiments described herein.

FIGS. 11A-11D schematically illustrate various views of an example first segment of the heat spreader compatible with certain embodiments described herein.

FIGS. 13A-13D schematically illustrate various views of an example third segment of the heat spreader compatible with certain embodiments described herein.

DETAILED DESCRIPTION OF THE PREFERRED EMBODIMENT

Heat spreaders generally distribute the heat evenly across the surface area of the electronic module (e.g., memory module), and they also tend to heat cooler components on the module, thereby causing these components to operate at slower speeds. For example, for fully-buffered dual-inline memory module (FBDIMM) designs which use an advanced memory buffer (AMB), heat dissipated by the AMB can increase its temperature to 125° C. or more. This increased temperature not only degrades the performance of the AMB, but also affects its long-term reliability. Existing heat spreaders typically either cover the entire module on both sides, or are localized to draw heat from the AMB, which is typically the hottest component on the module.

In certain embodiments described herein, a heat spreader advantageously draws heat efficiently from the hotter components on the module, thereby significantly improving the thermal profile of the module. Certain embodiments described herein advantageously provide heat transfer from the module while keeping the overall thickness of the combined heat spreader and module sufficiently small to fit within the space available in conventional computer systems. For example, in certain embodiments described herein, the overall thickness of the combined heat spreader and module is in a range between about 7 millimeters and about 25 millimeters. Furthermore, certain embodiments described herein advantageously avoid heat from hotter components on the module from unduly heating cooler components on the module.

Figure 1B:
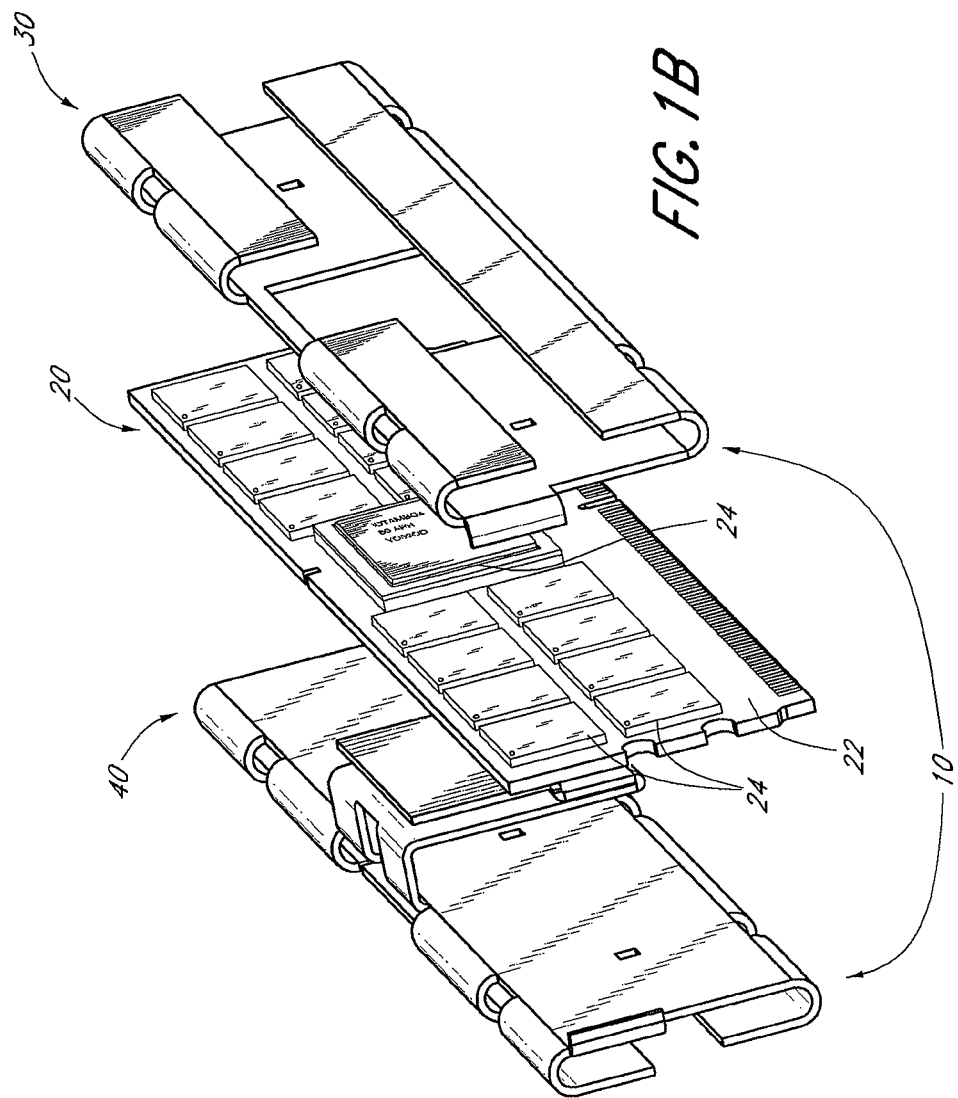
Figure 1C:
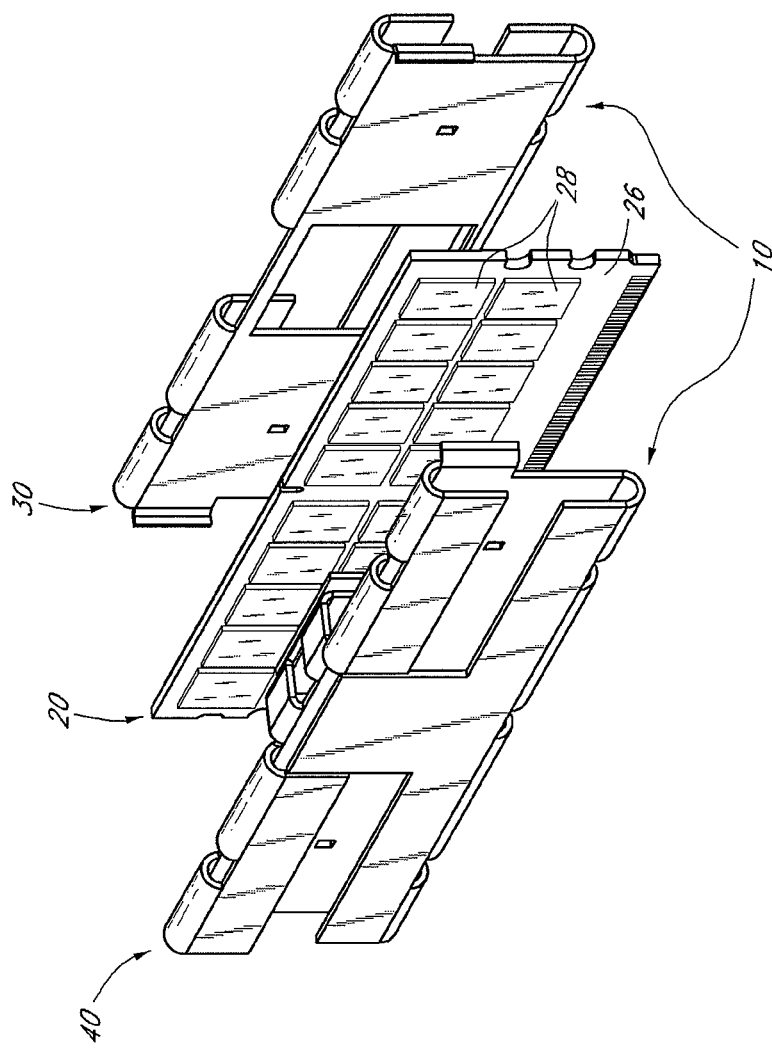

FIGS. 1A-1C schematically illustrate exploded views from various angles of an example heat spreader 10 compatible with certain embodiments described herein. The heat spreader 10 is designed for use with an electronic module 20. The module 20 has a first side 22 with a first plurality of electronic components 24 mounted thereon. The module 20 also has a second side 26 with a second plurality of electronic components 28 mounted thereon. The heat spreader 10 comprises a first segment 30 mountable on the module 20 to be in thermal communication with at least one electronic component 24 mounted on the first side 22, and to be substantially thermally isolated from at least one electronic component 24 mounted on the first side 22. The heat spreader 10 further comprises a second segment 40 mountable on the module 20 to be in thermal communication with the at least one electronic component 24 mounted on the first side 22 that is substantially thermally isolated from the first segment 30.

In certain embodiments, the first segment 30 is reversibly mounted on the module 20 such that the first segment 30 is removable from the module 20 without appreciably damaging the module 20. In certain embodiments, the second segment 40 is reversibly mounted on the module 20 such that the second segment 40 is removable from the module 20 without appreciably damaging the module 20.

Figure 2A:
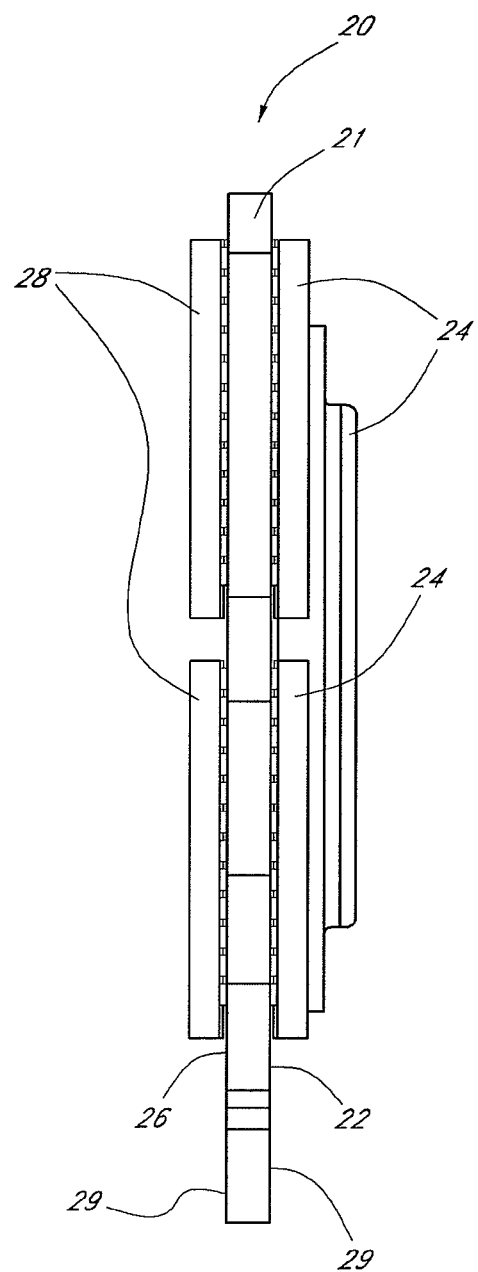
FIGS. 2A-2C schematically illustrate an example FBDIMM.
Figure 2B:
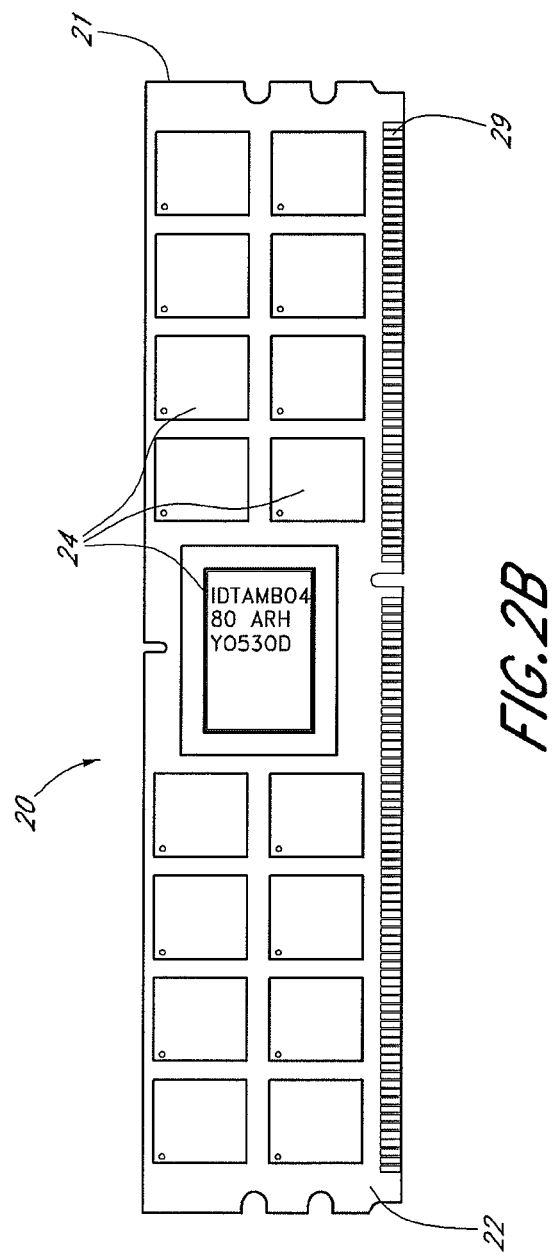
Figure 2C:
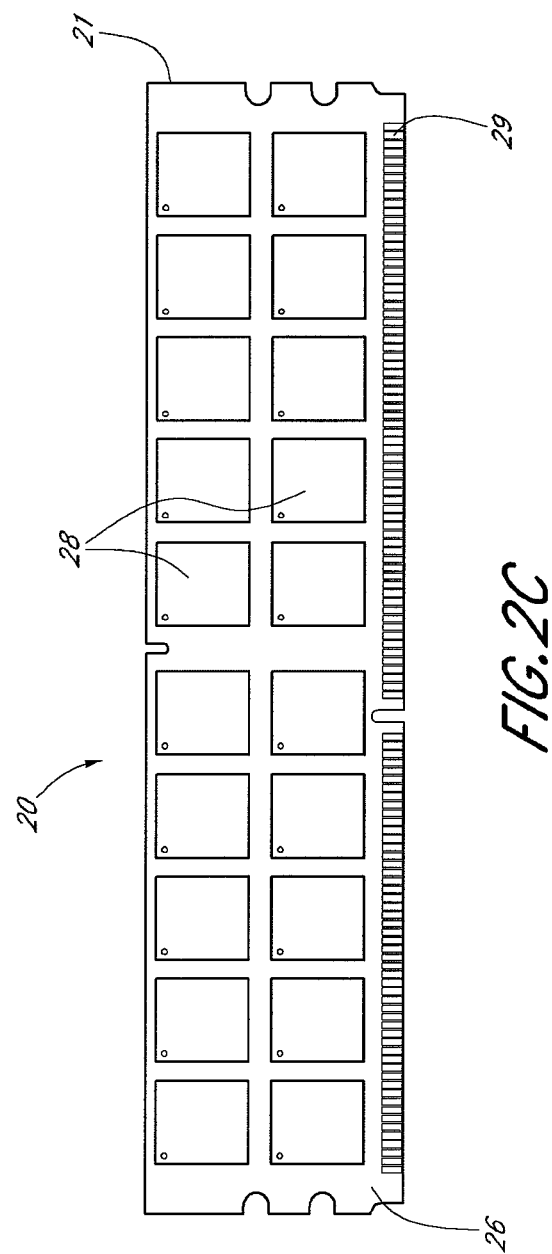

The heat spreader 10 schematically illustrated by FIGS. 1A-1C is designed for use with a FBDIMM, such as the example FBDIMM schematically illustrated by FIGS. 2A-2C. The FBDIMM comprises a printed-circuit board 21 having a first side 22 and a second side 26, with electronic components 24, 28 mounted thereon. The electronic components 24 mounted on the first side 22 comprise a plurality of memory (e.g., dynamic random-access memory or DRAM) devices and an advanced memory buffer ("AMB"). In certain embodiments, the memory devices on the first side 22 are substantially the same as one another. The electronic components 28 mounted on the second side 26 comprise a plurality of memory devices. In certain embodiments, the memory devices on the second side 26 are substantially the same as one another and as the memory devices on the first side 22. The FBDIMM also comprises a plurality of edge connectors 29 along at least one edge of the printed-circuit board 21. The edge connectors 29 are configured to be electrically coupled to a corresponding plurality of electrical contacts of a module slot of the computer system with which the module 20 is to be used. The edge connectors 29 are electrically coupled to the electronic components 24, 28 of the module 20 by electrical conduits (not shown) of the printed-circuit board 21. Examples of computer systems with which heat spreaders compatible with certain embodiments described herein may be used include, but are not limited to, desktop computers, workstations, servers, telecom systems, and media centers.

Other heat spreaders compatible with certain embodiments described herein are designed for use with other types of memory modules, including but not limited to dual in-line memory modules (DIMMs), small-outline DIMMs (SO-DIMMs), unbuffered DIMMs (UDIMMs), registered DIMMs (RDIMMs), rank-buffered DIMMs (RBDIMMs), mini-DIMMs, and micro-DIMMs. Memory devices compatible with certain embodiments described herein include, but are not limited to, random-access memory (RAM), dynamic random-access memory (DRAM), synchronous DRAM (SDRAM), and double-data-rate DRAM (e.g., SDR, DDR-1, DDR-2, DDR-3). In addition, memory devices having bit widths of 4, 8, 16, 32, as well as other bit widths, are compatible with certain embodiments described herein. Memory devices compatible with certain embodiments described herein have packaging which include, but are not limited to, thin small-outline package (TSOP), ball-grid-array (BGA), fine-pitch BGA (FBGA), micro-BGA (μBGA), mini-BGA (mBGA), and chip-scale packaging (CSP), and three-dimensional packaging (e.g., chip stacks, die stacks, and dual die packaging). Other heat spreaders compatible with certain embodiments described herein are designed for use with other types of electronic modules having at least two sides and having electronic components on each of the two sides.

Figure 3A:
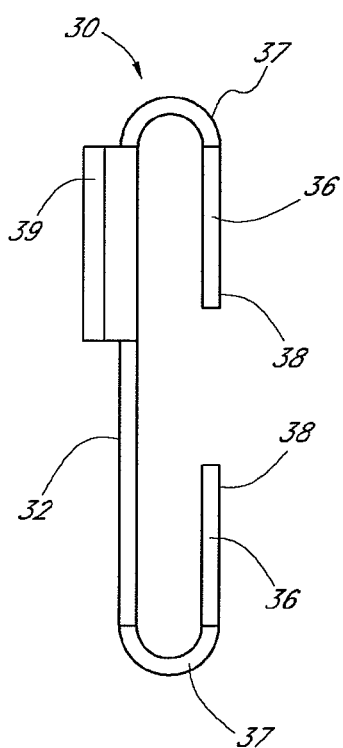
Figure 3C:
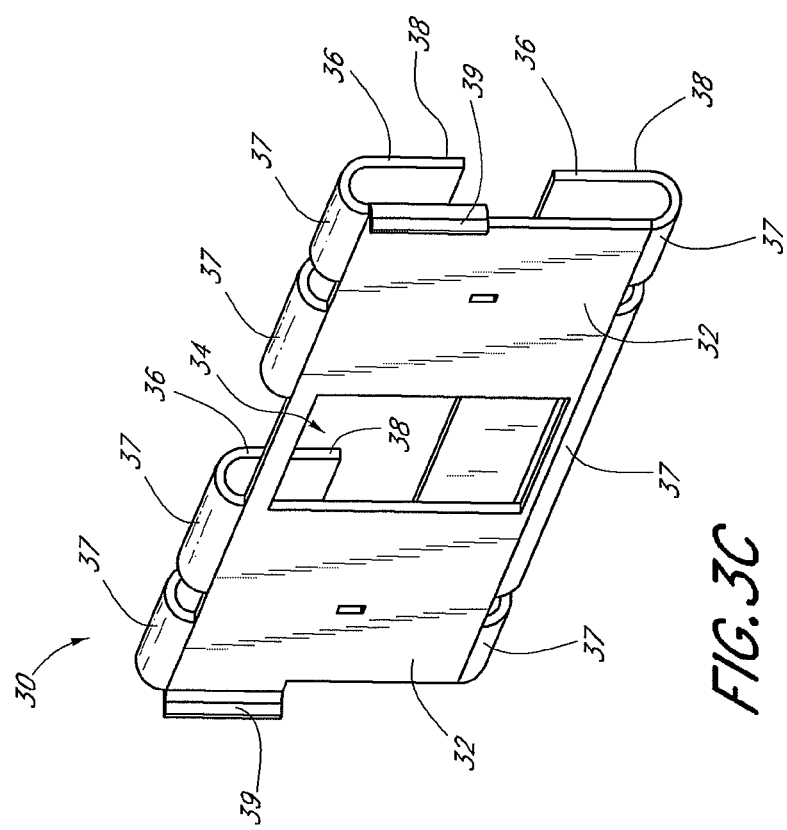

FIGS. 3A-3C schematically illustrate various views of an example first segment 30 of the heat spreader 10 compatible with certain embodiments described herein. The first segment 30 of certain embodiments comprises a thermally conductive material (e.g., metals, copper, aluminum, copper alloy, aluminum alloy, metal matrix composites, carbon composites). In certain embodiments, the first segment 30 comprises a single unitary element or piece of material which is formed into a configuration as described herein. For example, the first segment 30 can be formed from a single sheet of metal cut, bent, or both cut and bent into a configuration as described herein. Various ranges of thicknesses of the sheet are compatible with certain embodiments described herein, including but not limited to between 0.1 millimeter and 3 millimeters, between 0.1 millimeter and 1 millimeter, between 0.3 millimeter and 1 millimeter, and between 0.3 millimeter and 0.7 millimeter. In certain other embodiments, the first segment 30 comprises a plurality of elements which are connected together in a configuration as described herein.

In certain embodiments, the first segment 30 comprises a portion 32 that is configured to be in thermal communication with one or more of the electronic components 24 on the first side 22 of the module 20. For example, the portion 32 schematically illustrated in FIGS. 3A-3C comprises a substantially flat area that is positionable to be in thermal communication with the memory devices on the first side 22 of the FBDIMM schematically illustrated in FIGS. 2A-2C. In certain other embodiments, the portion 32 is not flat, but is contoured to fit with and to be in thermal communication with at least some of the electronic components 24 on the first side 22 of the module 20.

In certain embodiments, the heat spreader 10 further comprises a thermally conductive material 35a configured to be placed between the portion 32 and the electronic components 24 on the first side 22 of the module 20 with which the portion 32 is in thermal communication. The thermally conductive material 35a advantageously improves the thermal conductivity between the portion 32 and the electronic components 24. Thermally conductive materials compatible with certain embodiments described herein include, but are not limited to, thermal pads (e.g., a gap-filling material or a phase-changing material), thermally conductive adhesives, and thermal grease or paste. In view of the description provided herein, persons skilled in the art can select an appropriate thermally conductive material in accordance with certain embodiments described herein.

In certain embodiments, the first segment 30 further comprises a cut-out or hole 34 that is configured to substantially thermally isolate the first segment 30 from at least one electronic component 24 on the first side 22 of the module 20. For example, the hole 34 schematically illustrated in FIGS. 3A-3C is configured to substantially thermally isolate the first segment 30 from the AMB on the first side 22 of the FBDIMM schematically illustrated in FIGS. 2A-2C. In certain embodiments, the hole 34 thermally isolates the AMB on the first side 22 from the memory devices on the first side 22, thereby advantageously reducing over-heating of these memory devices due to heat from the AMB.

Figure 3D:
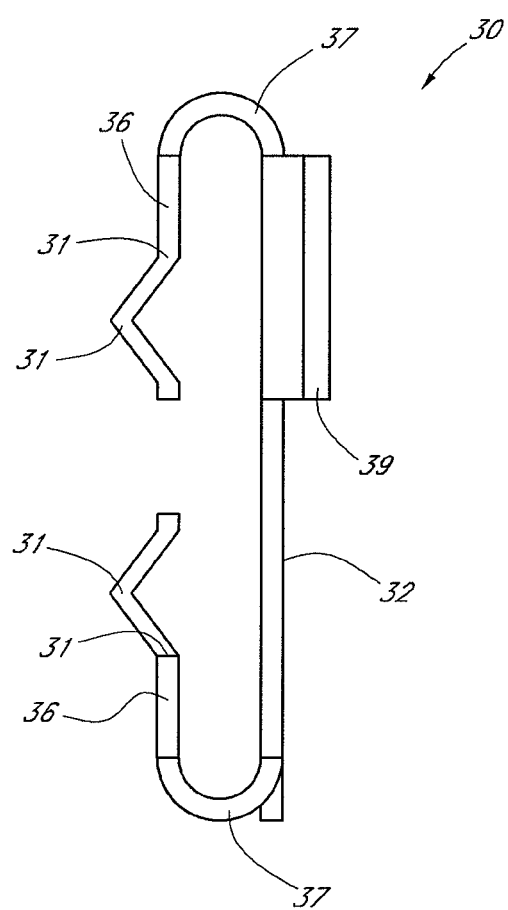
FIG. 3D schematically illustrates an example first segment having a non-planar portion.
Figure 3E:
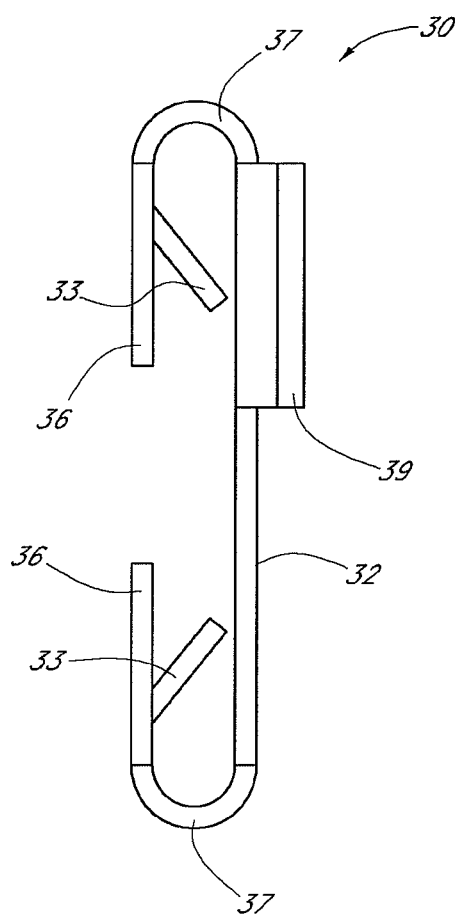
FIG. 3E schematically illustrates an example first segment having one or more louvers or fins.

In certain embodiments, the first segment 30 further comprises a portion 36 in thermal communication with the portion 32. The portion 36 is configured to remove heat conducted by the portion 32 away from the module 20. For example, the portion 36 schematically illustrated in FIGS. 3A-3C extends generally away from the portion 32 and provides a thermal conduit for heat from the first side 22 of the FBDIMM away from the FBDIMM. The portion 36 schematically illustrated by FIGS. 3A-3C comprises one or more angled or curved portions 37 and one or more generally planar portions 38. In certain embodiments, the portion 36 has a surface (e.g., a surface of the portion 38) which extends generally parallel to the portion 32. The portion 32 and the portion 36 generally define a region (e.g., a channel having a "C"-shaped cross-section as shown in FIGS. 3A-3C or a "U"-shaped cross-section as shown in FIGS. 11A-11D) therebetween through which air can flow to cool the module 20. In certain embodiments, at least a portion of the region through which air flows is spaced from the surface in a direction generally perpendicular to the surface. In certain embodiments, the region is generally symmetric about a center line extending along a length of the portion 32. In certain embodiments, the portion 38 is not generally planar but has one or more angles or curves 31 which advantageously provide increased surface area for heat transfer away from the module 20. One example of such structures is schematically illustrated by FIG. 3D. In certain embodiments, the portion 36 comprises one or more protrusions 33 (e.g., louvers or fins), as schematically illustrated by FIG. 3E, that generally extend away from the surface of the portion 36. In certain embodiments, the one or more protrusions 33 advantageously enhance the heat removal from the module 20 by perturbing the air flow through the region and increasing the surface area for heat transfer away from the module 20.

In certain embodiments, the first segment 30 further comprises one or more supports 39 configured to be mechanically coupled to the printed-circuit board 21 or to other portions of the heat spreader 10 to provide structural support for the first segment 30 on the module 20. For example, the supports 39 schematically illustrated in FIGS. 3A-3C comprise a pair of tabs configured to be mechanically coupled to the printed-circuit board 21 to support the first segment 30 against a portion of the printed-circuit board 21 of the FBDIMM schematically illustrated in FIGS. 2A-2C.

Figure 4A:
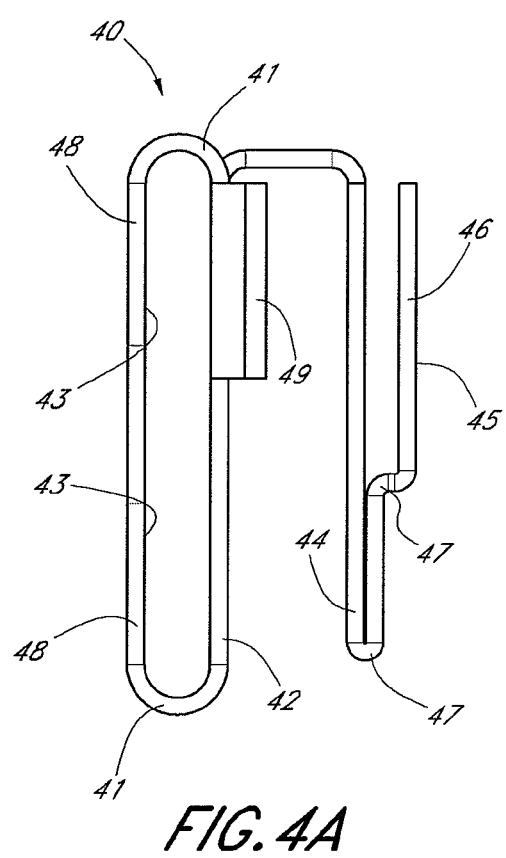
FIGS. 4A-4C schematically illustrate various views of an example second segment of the heat spreader compatible with certain embodiments described herein.
Figure 4B:
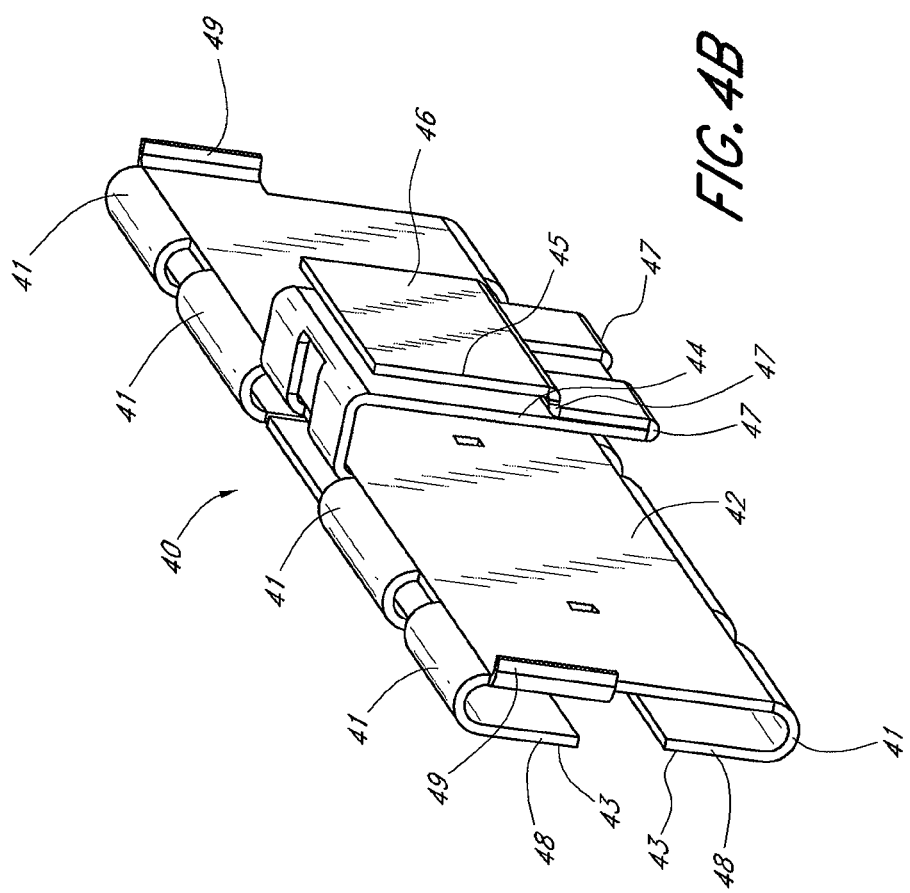
Figure 4C:
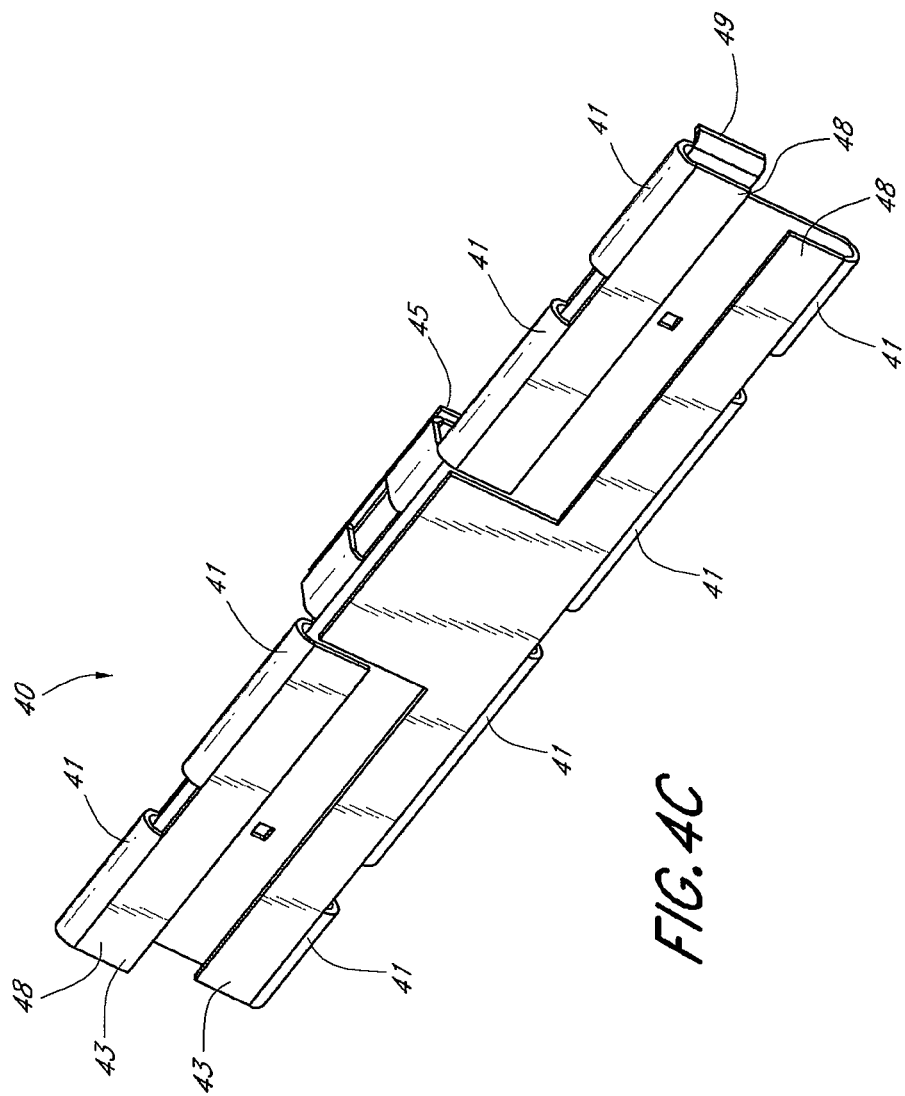

FIGS. 4A-4C schematically illustrate various views of an example second segment 40 of the heat spreader 10 compatible with certain embodiments described herein. The second segment 40 of certain embodiments comprises a thermally conductive material (e.g., metals, copper, aluminum, copper alloy, aluminum alloy, metal matrix composites, carbon composites). In certain embodiments, the second segment 40 comprises a single unitary element or piece of material which is formed into a configuration as described herein. For example, the second segment 40 can be formed from a single sheet of metal cut, bent, or both cut and bent into a configuration as described herein. Various ranges of thicknesses of the sheet are compatible with certain embodiments described herein, including but not limited to between 0.1 millimeter and 3 millimeters, between 0.1 millimeter and 1 millimeter, between 0.3 millimeter and 1 millimeter, and between 0.3 millimeter and 0.7 millimeter. In certain other embodiments, the second segment 40 comprises a plurality of elements which are connected together in a configuration as described herein.

In certain embodiments, the second segment 40 comprises a portion 42 that is configured to be in thermal communication with one or more of the electronic components 28 on the second side 26 of the module 20. For example, the portion 42 schematically illustrated in FIGS. 4A-4C comprises a substantially flat area that is positionable to be in thermal communication with the memory devices on the second side 26 of the FBDIMM schematically illustrated in FIGS. 2A-2C. In certain other embodiments, the portion 42 is not flat, but is contoured to fit with and to be in thermal communication with at least some of the electronic components 28 on the second side 26 of the module 20.

In certain embodiments, the heat spreader 10 further comprises a thermally conductive material 35b configured to be placed between the portion 42 and the electronic components 28 on the second side 24 of the module 20 with which the portion 42 is in thermal communication. The thermally conductive material 35b advantageously improves the thermal conductivity between the portion 42 and the electronic components 28. Thermally conductive materials compatible with certain embodiments described herein include, but are not limited to, thermal pads (e.g., a gap-filling material or a phase-changing material), thermally conductive adhesives, and thermal grease or paste. In view of the description provided herein, persons skilled in the art can select an appropriate thermally conductive material in accordance with certain embodiments described herein.

In certain embodiments, the second segment 40 further comprises a portion 44 that is configured to be in thermal communication with the at least one electronic component 24 on the first side 22 of the module 20 that is substantially thermally isolated from the first segment 30. For example, the portion 44 schematically illustrated in FIGS. 4A-4C comprises a substantially flat area configured to be in thermal communication with the AMB on the first side 22 of the FBDIMM schematically illustrated in FIGS. 2A-2C. In certain other embodiments, the portion 44 is not flat, but is contoured to fit and to be in thermal communication with the at least one electronic component 24 on the first side 22 of the module 20 that is substantially thermally isolated from the first segment 30. The portion 44 of certain embodiments is also substantially thermally isolated from other electronic components 24 on the first side 22 of the module 20. For example, the portion 44 schematically illustrated in FIGS. 4A-4C is substantially thermally isolated from the memory devices on the first side 22 of the FBDIMM schematically illustrated in FIGS. 2A-2C. In certain embodiments, the portion 44 advantageously removes heat from the AMB and the module 20. In certain embodiments, the portion 44 fits within the hole 34 so that the portion 44 is substantially thermally isolated from the first segment 30. In certain embodiments, the second segment 40 extends over an edge of the module 20 from the first side 22 of the module 20 to the second side 26 of the module 20, as schematically illustrated by FIGS. 4A-4C. In certain embodiments, the second segment 40 is mountable on the module 20 to also be in thermal communication with at least one electronic component 28 mounted on the second side 26 of the module 20.

In certain embodiments, the heat spreader 10 further comprises a thermally conductive material 35c configured to be placed between the portion 44 and the at least one electronic component 24 on the first side 22 of the module 20 with which the portion 44 is in thermal communication. The thermally conductive material 35c advantageously improves the thermal conductivity between the portion 44 and the at least one electronic component 24. Thermally conductive materials compatible with certain embodiments described herein include, but are not limited to, thermal pads (e.g., a gap-filling material or a phase-changing material), thermally conductive adhesives, and thermal grease or paste. In view of the description provided herein, persons skilled in the art can select an appropriate thermally conductive material in accordance with certain embodiments described herein.

In certain embodiments, the second segment 40 further comprises a portion 46 in thermal communication with the portion 44. The portion 46 is configured to remove heat conducted by the portion 44 away from the module 20. For example, the portion 46 schematically illustrated in FIGS. 4A-4C extends generally away from the portion 44 and provides a thermal conduit for heat from the AMB on the first side 22 of the FBDIMM away from the FBDIMM. The portion 46 schematically illustrated by FIGS. 4A-4C comprises one or more angled or curved portions 47 and one or more generally planar portions 45. In certain embodiments, the portion 46 has a surface (e.g., a surface of the portion 45) which extends generally parallel to the portion 46. The portion 44 and the portion 46 generally define a region (e.g., a channel having a "C"-shaped cross-section or a "U"-shaped cross-section) therebetween through which air can flow to cool the module 20. In certain embodiments, at least a portion of the region through which air flows is spaced from the surface in a direction generally perpendicular to the surface. In certain embodiments, the region is generally symmetric about a center line extending along a length of the portion 46. In certain embodiments, the portion 45 is not generally planar but has angles or curves which advantageously provide increased heat transfer away from the module 20. In certain embodiments, the portion 46 comprises one or more protrusions (e.g., louvers or fins) that generally extend away from the surface of the portion 46. In certain embodiments, the one or more protrusions advantageously enhance the heat removal from the module 20 by perturbing the air flow through the region and increasing the surface area for heat transfer away from the module 20.

In certain embodiments, the second segment 40 further comprises a portion 48 in thermal communication with the portion 42. The portion 48 is configured to remove heat conducted by the portion 42 away from the module 20. For example, the portion 48 schematically illustrated in FIGS. 4A-4C extends generally away from the portion 42 and provides a thermal conduit for heat from the memory devices on the second side 26 of the FBDIMM away from the FBDIMM. The portion 48 schematically illustrated by FIGS. 4A-4C comprises one or more angled or curved portions 41 and one or more generally planar portions 43. In certain embodiments, the portion 48 has a surface (e.g., a surface of the portion 43) which extends generally parallel to the portion 42. The portion 42 and the portion 48 generally define a region (e.g., a channel having a "C"-shaped cross-section or a "U"-shaped cross-section) therebetween through which air can flow to cool the module 20. In certain embodiments, at least a portion of the region through which air flows is spaced from the surface in a direction generally perpendicular to the surface. In certain embodiments, the region is generally symmetric about a center line extending along a length of the portion 42. In certain embodiments, the portion 43 is not generally planar but has angles or curves which advantageously provide increased surface area for heat transfer away from the module 20. In certain embodiments, the portion 48 comprises one or more protrusions (e.g., louvers or fins) that generally extend away from the surface of the portion 36. In certain embodiments, the one or more protrusions advantageously enhance the heat removal from the module 20 by perturbing the air flow through the region and increasing the surface area for heat transfer away from the module 20.

In certain embodiments, the second segment 40 further comprises one or more supports 49 configured to be mechanically coupled to the printed-circuit board 21 or to other portions of the heat spreader 10 to provide structural support for the second segment 40 on the module 20. For example, the supports 49 schematically illustrated in FIGS. 4A-4C comprise a pair of tabs configured to be mechanically coupled to the printed-circuit board 21 to support the second segment 40 against a portion of the printed-circuit board 21 of the FBDIMM schematically illustrated in FIGS. 2A-2C.

Figure 5A:
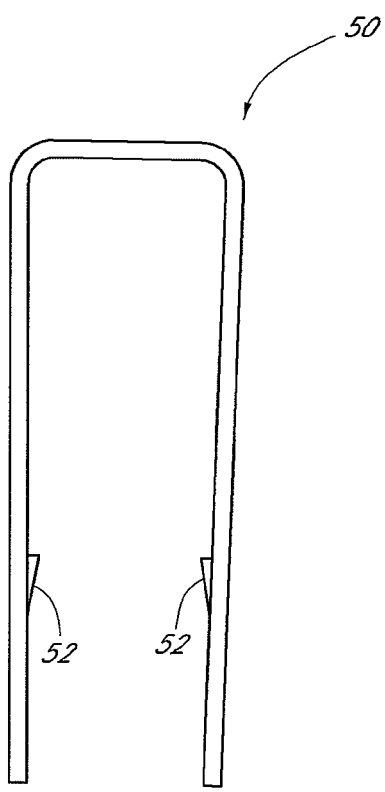
FIGS. 5A and 5B schematically illustrate an example fastener compatible with certain embodiments described herein.
Figure 5B:
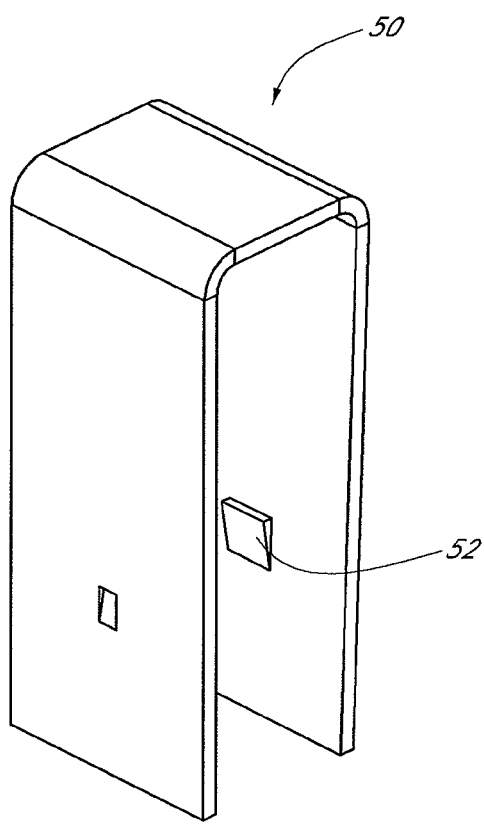

In certain embodiments, the first segment 30 and the second segment 40 are held in place on the module 20 by one or more fasteners 50 (e.g., clips) mountable on the first segment 30 and the second segment 40. FIGS. 5A and 5B schematically illustrate an example fastener 50 compatible with certain embodiments described herein. The fastener 50 has a general "U"-shape which fits over respective portions of the first segment 30 and the second segment 40. The fastener 50 provides a tension spring force which holds the first segment 30 and the second segment 40 in place on either side 22, 26 of the module 20. In certain embodiments, the fastener 50 comprises one or more protrusions 52, as schematically illustrated in FIGS. 5A and 5B. These protrusions 52 mate with corresponding recesses on the first segment 30 and the second segment 40, thereby advantageously increasing the stability of the heat spreader 10. In certain other embodiments, the fasteners 50 comprise recesses which mate with corresponding protrusions on the first segment 30 and the second segment 40. FIG. 6 schematically illustrates an exploded view of an example configuration of fasteners 50 with the first segment 30, the second segment 40, and the module 20. Other configurations of fasteners 50 or other structures for holding the heat spreader 10 on the module 20 are also compatible with certain embodiments described herein. For example, in certain embodiments, adhesives can be used as fasteners 50 to bond the portions of the heat spreader 10 together with the module 20.

Figure 7A:
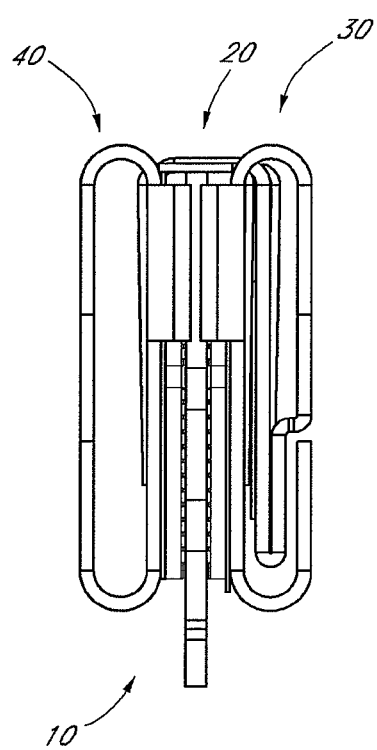
FIGS. 7A-7C schematically illustrate various views of an example assembled heat spreader on the module in accordance with certain embodiments described herein.
Figure 7B:
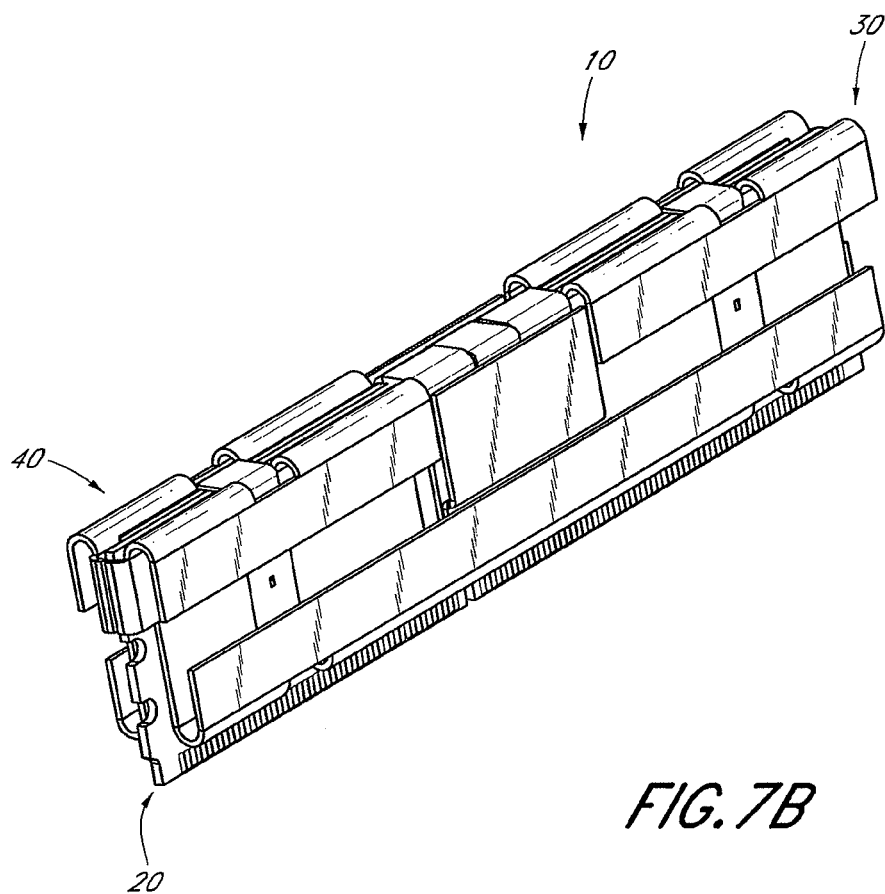
Figure 7C:
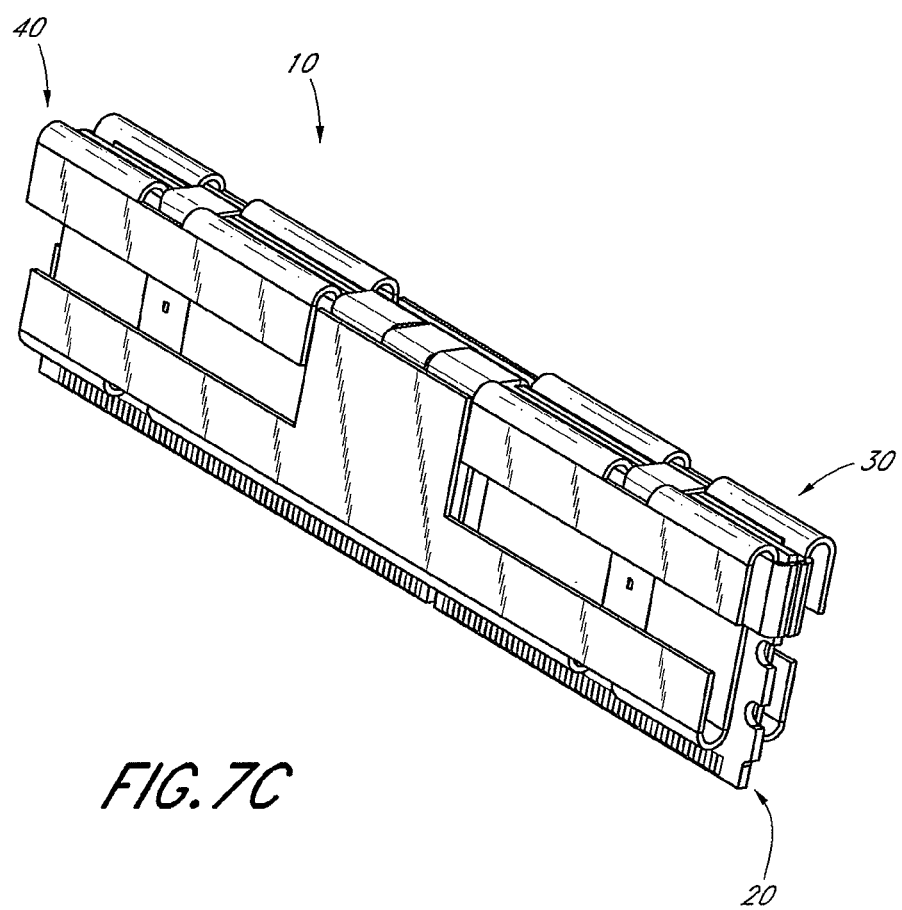
Figure 8:
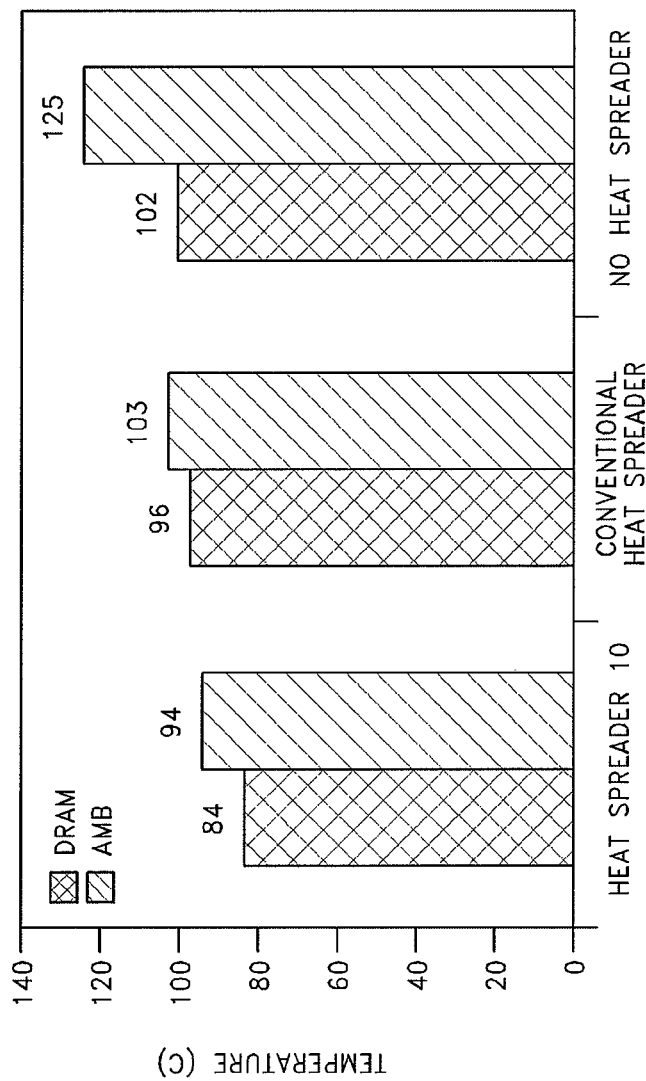
FIG. 8 is a bar graph illustrating the results of a simulation comparing the temperatures of the DRAM devices and the AMB of an FBDIMM with (i) no heat spreader; (ii) a conventional heat spreader; and (iii) a heat spreader compatible with embodiments described herein.

FIGS. 7A-7C schematically illustrate various views of an example assembled heat spreader 10 on the module 20 in accordance with certain embodiments described herein. The heat spreader 10 advantageously provides superior removal of heat from the module 20. FIG. 8 is a bar graph illustrating the results of a simulation comparing the temperatures of the DRAM devices and the AMB of a 2-GB, 40-millimeter-tall (1U form factor) FBDIMM operating at 677 MHz under an ambient temperature of 40° C. and an air flow of 2.5 meters/second with (i) no heat spreader; (ii) a conventional heat spreader comprising thermally conductive plates on both sides of the FBDIMM; and (iii) a heat spreader compatible with embodiments described herein. FIG. 8 illustrates that the heat spreader 10 provides significantly improved cooling over conventional heat spreaders.

Figure 9A:
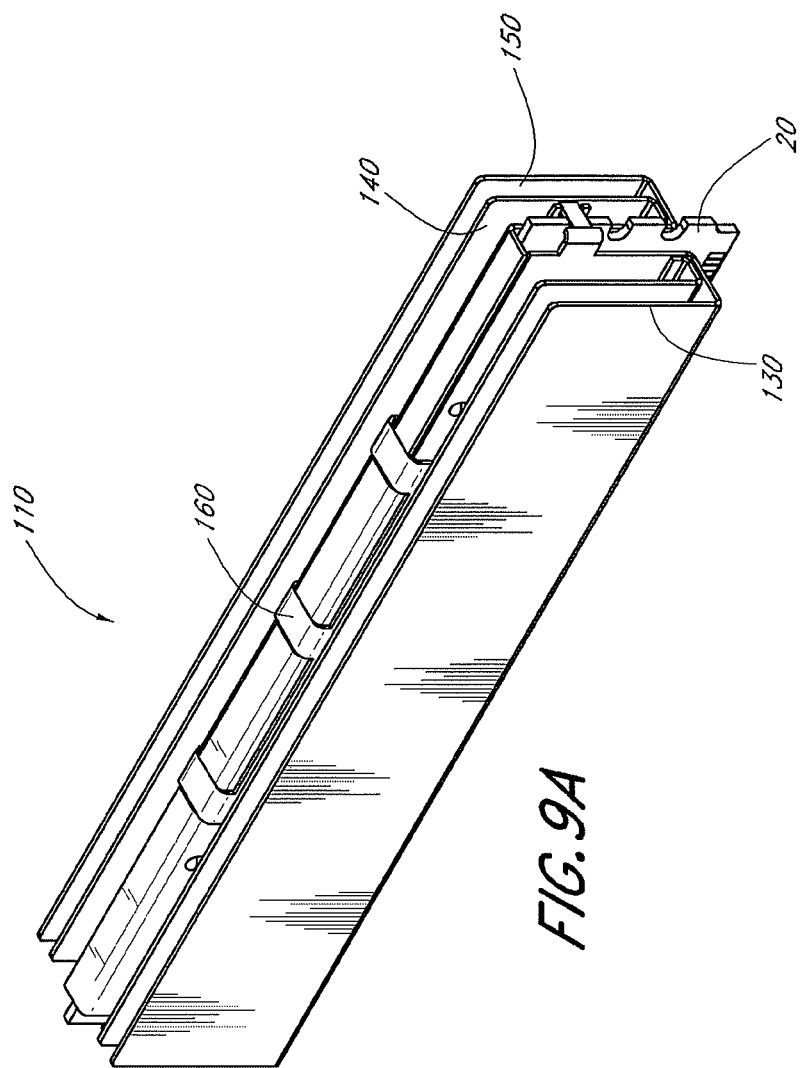
Figure 11A:
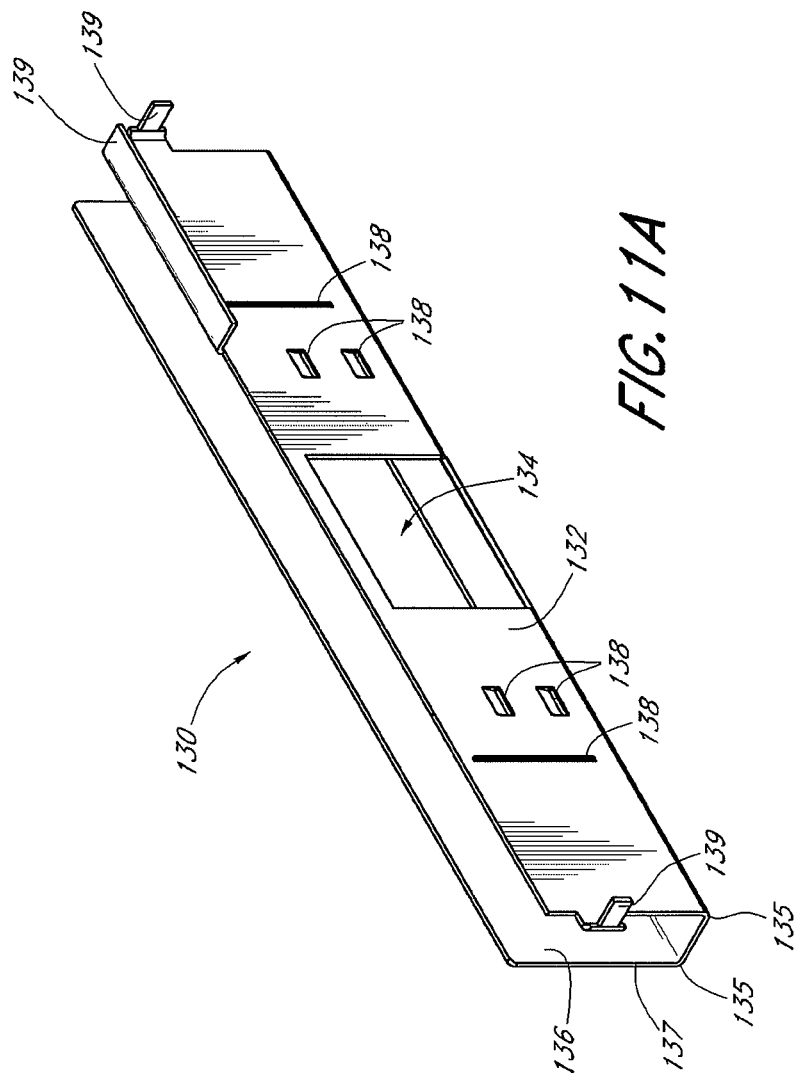
Figure 11B:
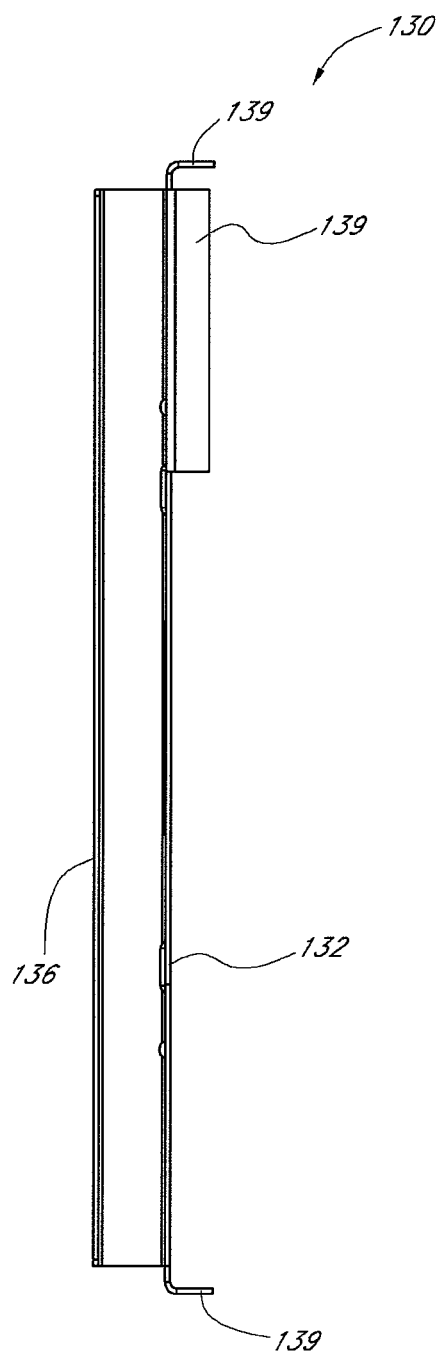
Figure 11C:
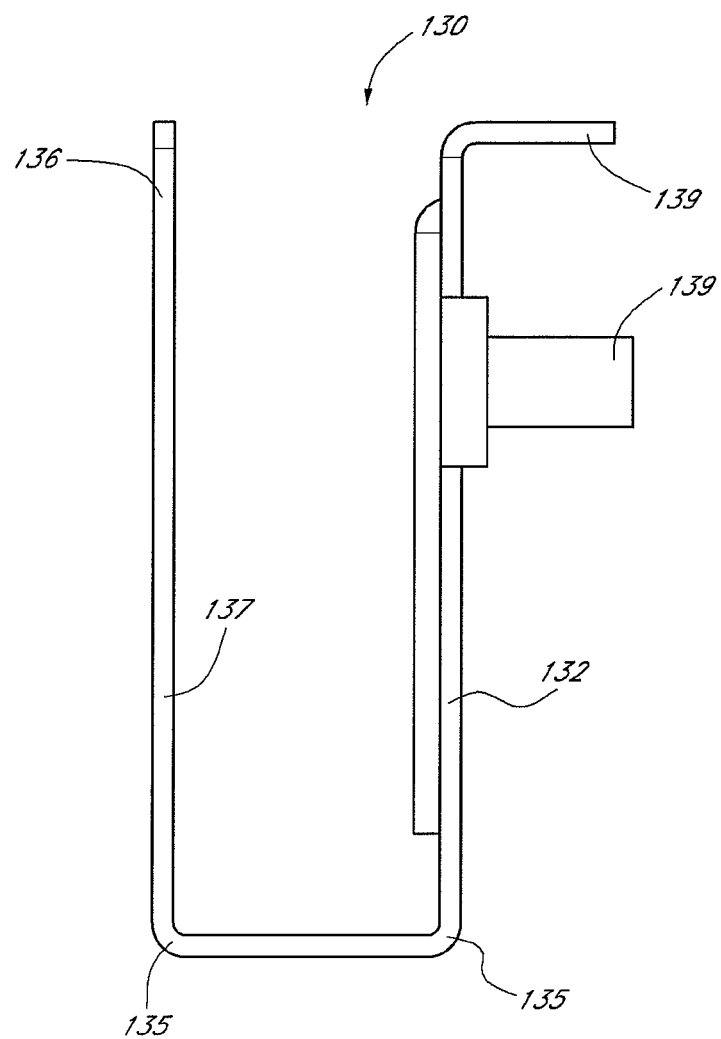
Figure 12A:
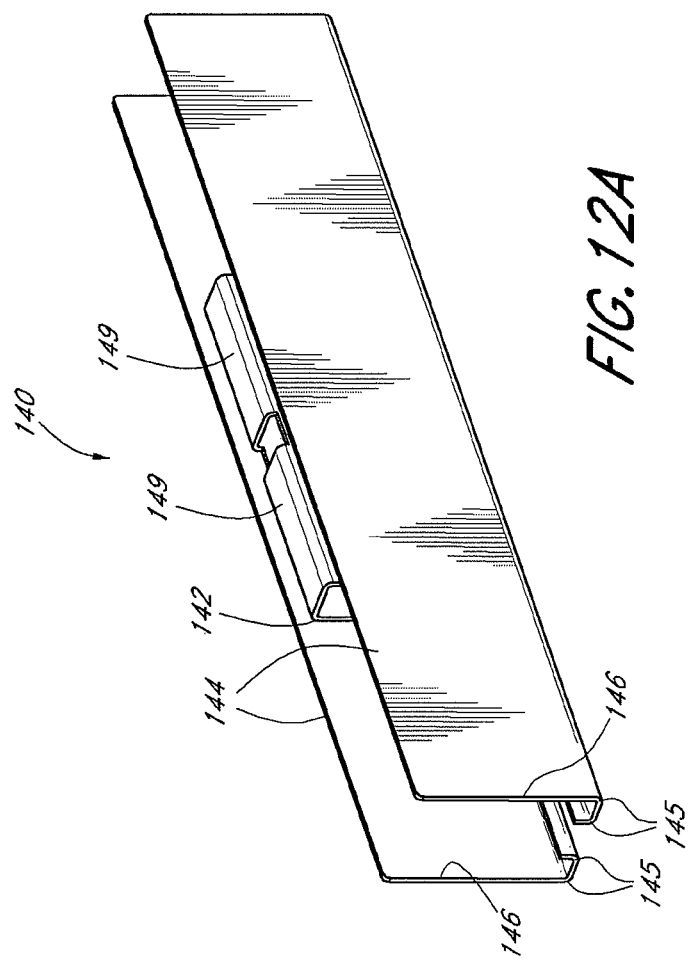
FIGS. 12A-12D schematically illustrate various views of an example second segment of the heat spreader compatible with certain embodiments described herein.
Figure 12B:
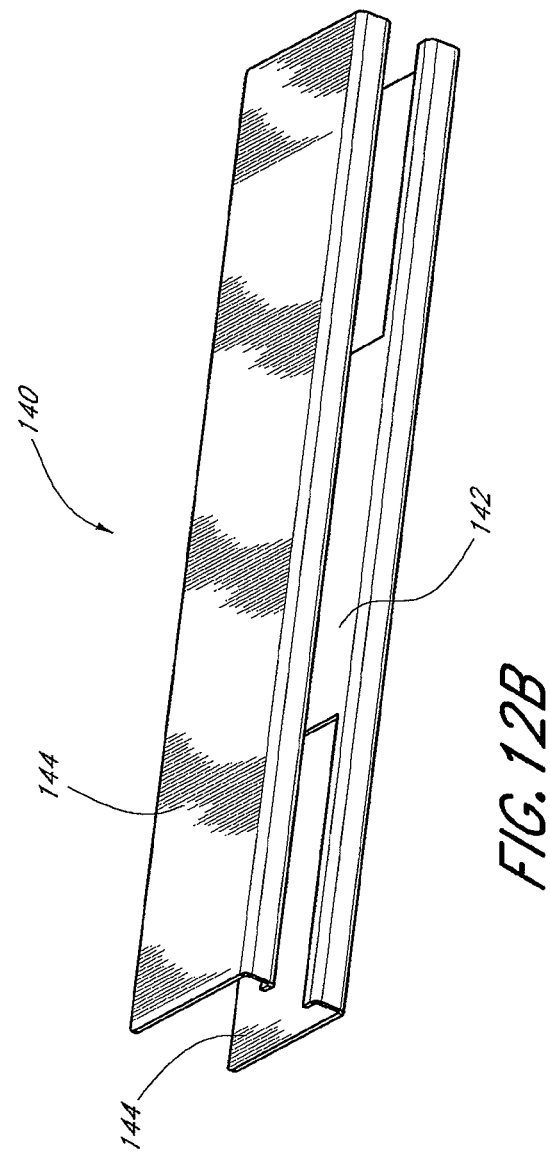
Figure 12C:
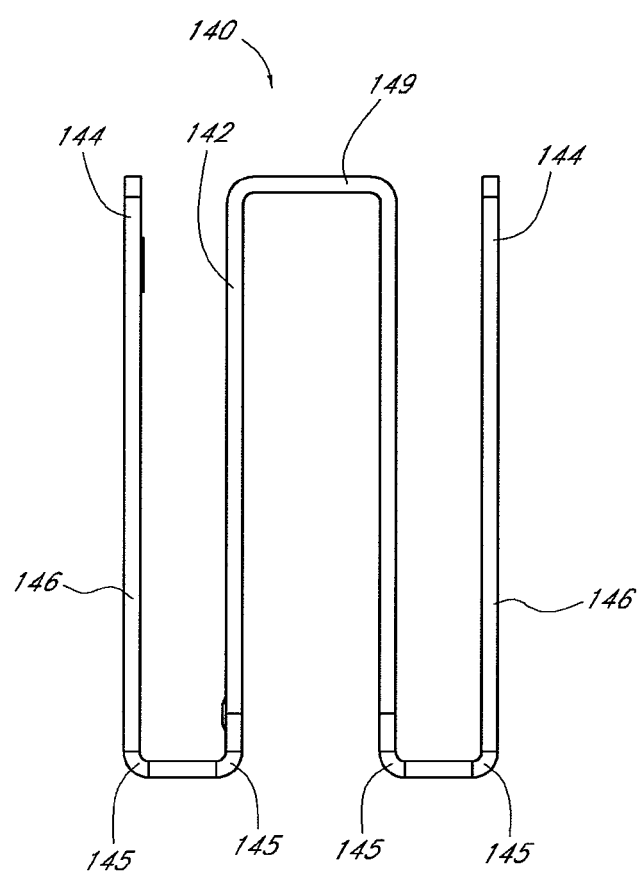
Figure 12D:
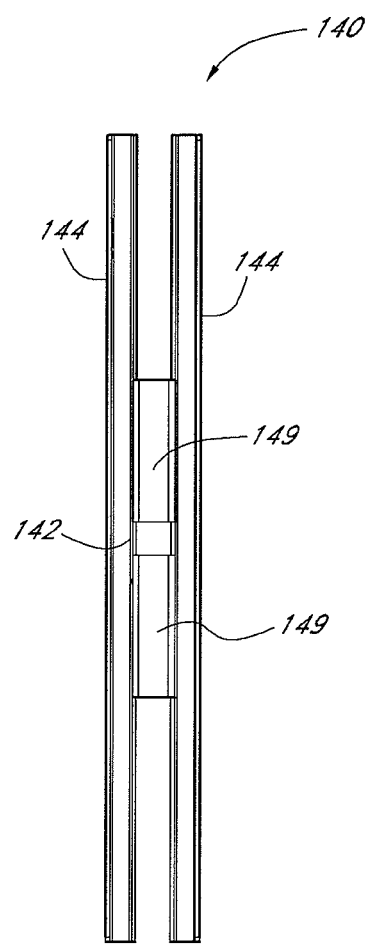
Figure 13B:
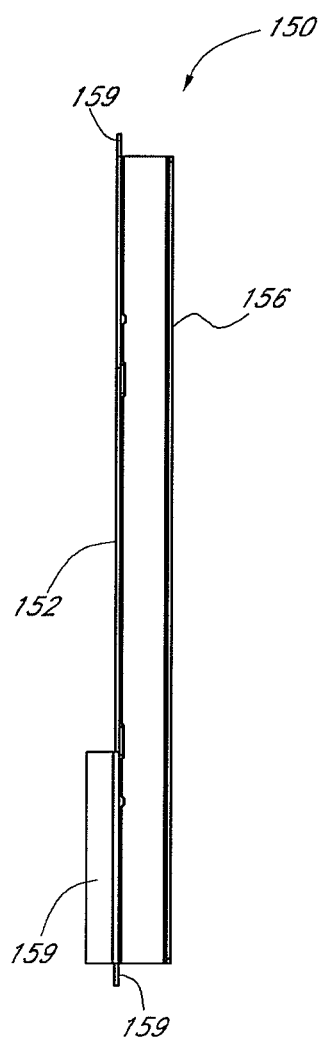
Figure 13C:
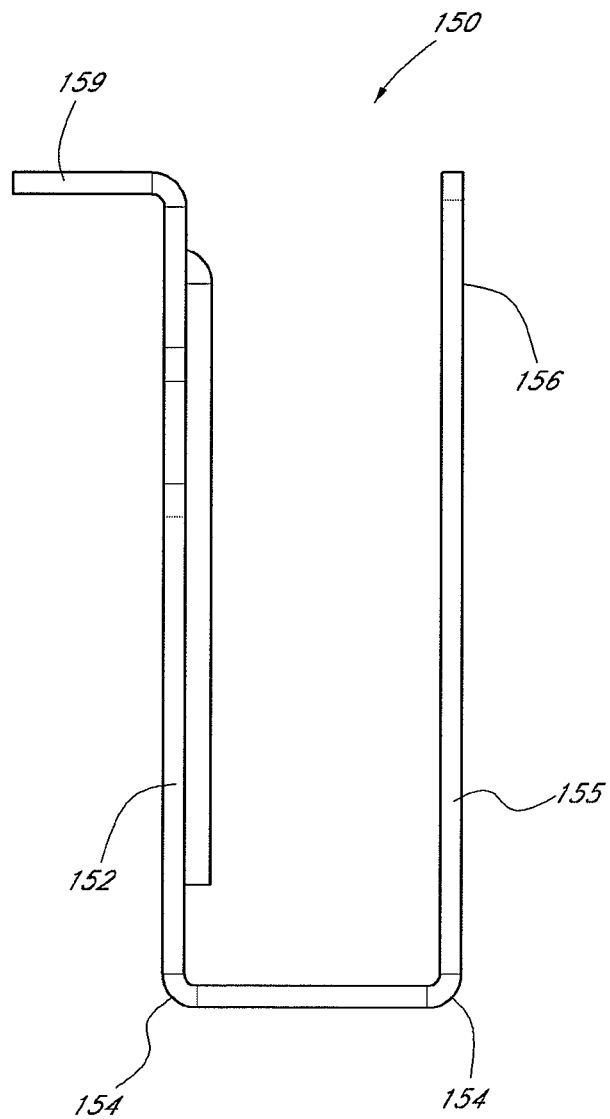
Figure 13D:
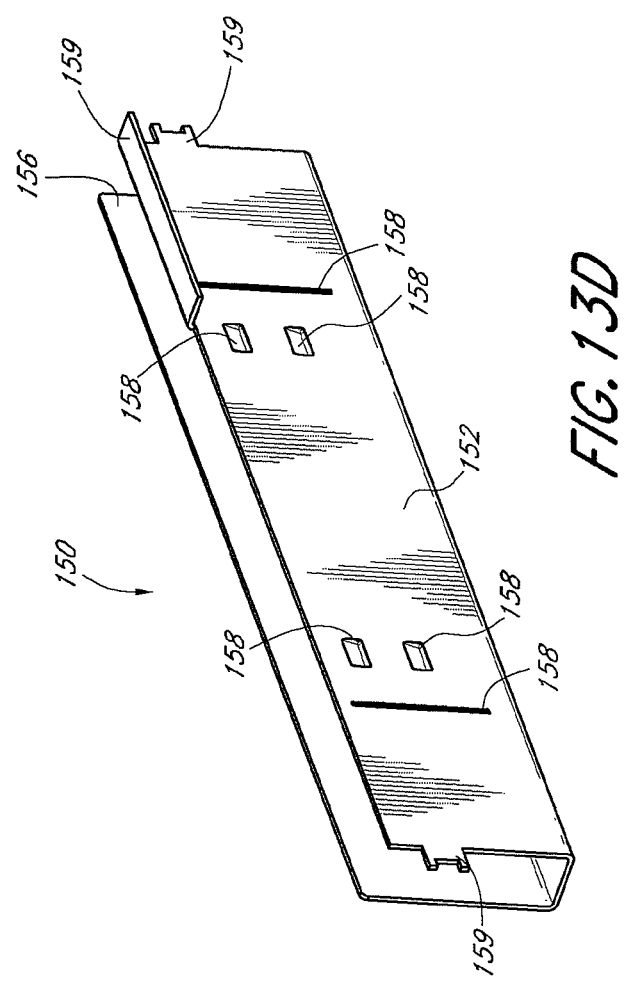

FIGS. 9A-9C schematically illustrate another example heat spreader 110 in accordance with certain embodiments described herein. FIGS. 10A and 10B schematically illustrate exploded views of the heat spreader 110 of FIGS. 9A-9C in accordance with certain embodiments described herein. The heat spreader 110 is designed for use with an electronic module 20 having a first side 22 with a first plurality of electronic components 24 mounted thereon and a second side 26 with a second plurality of electronic components 28 mounted thereon. The heat spreader 110 comprises a first segment 130 mountable on the module 20 to be in thermal communication with at least one electronic component 24 mounted on the first side 22, and to be substantially thermally isolated from at least one electronic component 24 mounted on the first side 22. The heat spreader 110 further comprises a second segment 140 mountable on the module 20 to be in thermal communication with the at least one electronic component 24 mounted on the first side 22 that is substantially thermally isolated from the first segment 130.

The heat spreader 110 schematically illustrated by FIGS. 9A-9C further comprises a third segment 150 mountable on the module 20 to be in thermal communication with at least one electronic component mounted on the second side 26 of the module 20. In certain embodiments, the third segment 150 is reversibly mounted on the module 20 such that the third segment 150 is removable from the module 20 without appreciably damaging the module 20. In certain embodiments, the heat spreader 110 further comprises a fastener 160 (e.g., clip) mountable on the first segment 130 and the second segment 140 to apply a force to the first segment 130 and the second segment 140 so that the first segment 130 and the second segment 140 are mechanically coupled to the module 20. In certain embodiments, the fastener 160 further applies a force to the third segment 150 so that the third segment is mechanically coupled to the module 20. In certain other embodiments, the fastener 160 can be an adhesive or another structure to bond the heat spreader 110 to the module 20.

FIGS. 11A-11D schematically illustrate various views of an example first segment 130 of the heat spreader 110 compatible with certain embodiments described herein. The first segment 130 of certain embodiments comprises a thermally conductive material (e.g., metals, copper, aluminum, copper alloy, aluminum alloy, metal matrix composites, carbon composites). In certain embodiments, the first segment 130 comprises a single unitary element or piece of material which is formed into a configuration as described herein. For example, the first segment 130 can be formed from a single sheet of metal cut, bent, or both cut and bent to be formed into a configuration as described herein. Various ranges of thicknesses of the sheet are compatible with certain embodiments described herein, including but not limited to between 0.1 millimeter and 3 millimeters, between 0.1 millimeter and 1 millimeter, between 0.3 millimeter and 1 millimeter, and between 0.3 millimeter and 0.7 millimeter. In certain other embodiments, the first segment 130 comprises a plurality of elements which are connected together in a configuration as described herein.

In certain embodiments, the first segment 130 comprises a portion 132 that is configured to be in thermal communication with one or more of the electronic components 24 on the first side 22 of the module 20. For example, the portion 132 schematically illustrated in FIGS. 11A-11D comprises a substantially flat area that is positionable to be in thermal communication with the memory devices on the first side 22 of the FBDIMM schematically illustrated in FIGS. 2A-2C. In certain other embodiments, the portion 132 is not flat, but is contoured to fit with and to be in thermal communication with at least some of the electronic components 24 on the first side 22 of the module 20.

In certain embodiments, the heat spreader 110 further comprises a thermally conductive material 131a configured to be placed between the portion 132 and the electronic components 24 on the first side 22 of the module 20 with which the portion 132 is in thermal communication. The thermally conductive material 131a advantageously improves the thermal conductivity between the portion 132 and the electronic components 24. Thermally conductive materials compatible with certain embodiments described herein include, but are not limited to, thermal pads (e.g., a gap-filling material or a phase-changing material), thermally conductive adhesives, and thermal grease or paste. In view of the description provided herein, persons skilled in the art can select an appropriate thermally conductive material in accordance with certain embodiments described herein.

In certain embodiments, the first segment 130 further comprises a cut-out or hole 134 that is configured to substantially thermally isolate the first segment 130 from at least one electronic component 24 on the first side 22 of the module 20. For example, the hole 134 schematically illustrated in FIGS. 11A-11D is configured to substantially thermally isolate the first segment 130 from the AMB on the first side 22 of the FBDIMM schematically illustrated in FIGS. 2A-2C. In certain embodiments, the hole 134 thermally isolates the AMB on the first side 22 from the memory devices on the first side 22, thereby advantageously reducing over-heating of these memory devices due to heat from the AMB.

In certain embodiments, the first segment 130 further comprises a portion 136 in thermal communication with the portion 132. The portion 136 is configured to remove heat conducted by the portion 132 away from the module 20. For example, the portion 136 schematically illustrated in FIGS. 11A-11D extends generally away from the portion 132 and provides a thermal conduit for heat from the memory devices on the first side 22 of the FBDIMM away from the FBDIMM. The portion 136 schematically illustrated by FIGS. 11A-11D comprises one or more angled or curved portions 135 and one or more generally planar portions 137. In certain embodiments, the portion 136 has a surface (e.g., a surface of the portion 137) which extends generally parallel to the portion 132. The portion 132 and the portion 136 generally define a region (e.g., a channel having a "C"-shaped cross-section or a "U"-shaped cross-section) therebetween through which air can flow to cool the module 20. In certain embodiments, at least a portion of the region through which air flows is spaced from the surface in a direction generally perpendicular to the surface. In certain embodiments, the region is generally symmetric about a center line extending along a length of the portion 132. In certain embodiments, the portion 137 is not generally planar but has angles or curves which advantageously provide increased surface area for heat transfer away from the module 20. In certain embodiments, the portion 136 comprises one or more protrusions (e.g., louvers or fins) that generally extend away from the surface of the portion 136. In certain embodiments, the one or more protrusions advantageously enhance the heat removal from the module 20 by perturbing the air flow through the region and increasing the surface area for heat transfer away from the module 20.

In certain embodiments, the first segment 130 further comprises one or more supports configured to be mechanically coupled to the printed-circuit board 21 or to other portions of the heat spreader 10. In certain embodiments, the one or more supports comprise one or more recesses 138 configured to mate with corresponding protrusions of the other portions of the heat spreader 110. In certain embodiments, instead of recesses 138, the one or more supports comprise protrusions that mate with corresponding structures of the other portions of the heat spreader 110. The supports are configured to provide structural support, alignment, and/or locking for assembly of the first segment 130 on the module 20 with the other segments of the heat spreader 110. For example, at least some of the supports schematically illustrated in FIGS. 11A-11D comprises one or more tabs 139 configured to support the first segment 130 against a portion of the printed-circuit board 21 of the FBDIMM schematically illustrated in FIGS. 2A-2C.

FIGS. 12A-12D schematically illustrate various views of an example second segment 140 of the heat spreader 110 compatible with certain embodiments described herein. The second segment 140 of certain embodiments comprises a thermally conductive material (e.g., metals, copper, aluminum, copper alloy, aluminum alloy, metal matrix composites, carbon composites). In certain embodiments, the second segment 140 comprises a single unitary element or piece of material which is formed into a configuration as described herein. For example, the second segment 140 can be formed from a single sheet of metal cut, bent, or both cut and bent into a configuration as described herein. Various ranges of thicknesses of the sheet are compatible with certain embodiments described herein, including but not limited to between 0.1 millimeter and 3 millimeters, between 0.1 millimeter and 1 millimeter, between 0.3 millimeter and 1 millimeter, and between 0.3 millimeter and 0.7 millimeter. In certain other embodiments, the second segment 140 comprises a plurality of elements which are connected together in a configuration as described herein.

In certain embodiments, the second segment 140 comprises a portion 142 that is configured to be in thermal communication with the one or more electronic components 24 on the first side 22 of the module 20 that are substantially thermally isolated from the first segment 130. For example, the portion 142 schematically illustrated in FIGS. 12A-12D comprises a substantially flat area that is positionable to be in thermal communication with the at least one electronic component 24 (e.g., the AMB) on the first side 22 of the FBDIMM schematically illustrated in FIGS. 2A-2C that is substantially thermally isolated from the first segment 130 and to advantageously remove heat from the at least one electronic component 24 and the module 20. In certain other embodiments, the portion 142 is not flat, but is contoured to fit with and to be in thermal communication with the at least one electronic component 24 on the first side 22 of the module 20 that is substantially thermally isolated from the first segment 130. In certain embodiments, the portion 142 is positioned relative to the hole 134 (e.g., fits within the hole 134) so that the portion 142 is substantially thermally isolated from the first segment 130. In certain embodiments, the second segment 140 extends over an edge of the module 20 from the first side 22 of the module 20 to the second side 26 of the module 20, as schematically illustrated by FIGS. 9A-9C.

In certain embodiments, the heat spreader 110 further comprises a thermally conductive material 131b configured to be placed between the portion 142 and the at least one electronic component 24 on the first side 22 of the module 20 with which the portion 142 is in thermal communication. The thermally conductive material 131b advantageously improves the thermal conductivity between the portion 142 and the at least one electronic component 24. Thermally conductive materials compatible with certain embodiments described herein include, but are not limited to, thermal pads (e.g., a gap filling material or a phase-changing material), thermally conductive adhesives, and thermal grease or paste. In view of the description provided herein, persons skilled in the art can select an appropriate thermally conductive material in accordance with certain embodiments described herein.

In certain embodiments, the second segment 140 further comprises one or more portions 144 in thermal communication with the portion 142. The portion 144 is configured to remove heat conducted by the portion 142 away from the module 20. For example, the portion 144 schematically illustrated in FIGS. 12A-12D extends generally away from the portion 144 and provides a thermal conduit for heat from the AMB on the first side 22 of the FBDIMM away from the FBDIMM. The portion 144 schematically illustrated by FIGS. 12A-12D comprises one or more angled or curved portions 145 and one or more generally planar portions 146. In certain embodiments, the portion 144 has a surface (e.g., a surface of the portion 146) that extends generally parallel to the portion 142. The portion 142 and the portion 144 generally define a region (e.g., a channel having a "C"-shaped cross-section or a "U"-shaped cross-section) therebetween through which air can flow to cool the module 20. In certain embodiments, at least a portion of the region through which air flows is spaced from the surface in a direction generally perpendicular to the surface. In certain embodiments, the region is generally symmetric about a center line extending along a length of the portion 142. In certain embodiments, the portion 146 is not generally planar but has angles or curves which advantageously provide increased surface area for heat transfer away from the module 20. In certain embodiments, the portion 144 comprises one or more protrusions (e.g., louvers or fins) that generally extend away from the surface of the portion 144. In certain embodiments, the one or more protrusions advantageously enhance the heat removal from the module 20 by perturbing the air flow through the region and increasing the surface area for heat transfer away from the module 20.

In certain embodiments, the second segment 140 further comprises one or more supports 149 configured to be mechanically coupled to the printed-circuit board 21 or to other portions of the heat spreader 110 to provide structural support for the second segment 140 on the module 20. For example, the supports 149 schematically illustrated in FIGS. 12A-12D are configured to support the second segment 140 against a portion of the printed-circuit board 21 of the FBDIMM schematically illustrated in FIGS. 2A-2C.

FIGS. 13A-13D schematically illustrate various views of an example third segment 150 of the heat spreader 110 compatible with certain embodiments described herein. The third segment 150 of certain embodiments comprises a thermally conductive material (e.g., metals, copper, aluminum, copper alloy, aluminum alloy, metal matrix composites, carbon composites). In certain embodiments, the third segment 150 comprises a single unitary element or piece of material which is formed into a configuration as described herein. For example, the third segment 150 can be formed from a single sheet of metal cut, bent, or both cut and bent into a configuration as described herein. Various ranges of thicknesses of the sheet are compatible with certain embodiments described herein, including but not limited to between 0.1 millimeter and 3 millimeters, between 0.1 millimeter and 1 millimeter, between 0.3 millimeter and 1 millimeter, and between 0.3 millimeter and 0.7 millimeter. In certain other embodiments, the third segment 150 comprises a plurality of elements which are connected together in a configuration as described herein.

In certain embodiments, the third segment 150 comprises a portion 152 that is configured to be in thermal communication with one or more of the electronic components 28 on the second side 26 of the module 20. For example, the portion 152 schematically illustrated in FIGS. 13A-13D comprises a substantially flat area that is positionable to be in thermal communication with the memory devices on the second side 26 of the FBDIMM schematically illustrated in FIGS. 2A-2C. In certain other embodiments, the portion 152 is not flat, but is contoured to fit with and to be in thermal communication with at least some of the electronic components 28 on the second side 26 of the module 20.

In certain embodiments, the heat spreader 110 further comprises a thermally conductive material 131c configured to be placed between the portion 152 and the electronic components 28 on the second side 26 of the module 20 with which the portion 152 is in thermal communication. The thermally conductive material 131c advantageously improves the thermal conductivity between the portion 152 and the electronic components 28. Thermally conductive materials compatible with certain embodiments described herein include, but are not limited to, thermal pads (e.g., a gap-filling material or a phase-changing material), thermally conductive adhesives, and thermal grease or paste. In view of the description provided herein, persons skilled in the art can select an appropriate thermally conductive material in accordance with certain embodiments described herein.

In certain embodiments, the third segment 150 further comprises a portion 156 in thermal communication with the portion 152. The portion 156 is configured to remove heat conducted by the portion 152 away from the module 20. For example, the portion 156 schematically illustrated in FIGS. 13A-13D extends generally away from the portion 152 and provides a thermal conduit for heat from the memory devices on the second side 26 of the FBDIMM away from the FBDIMM. The portion 156 schematically illustrated by FIGS. 13A-13D comprises one or more angled or curved portions 154 and one or more generally planar portions 155. In certain embodiments, the portion 156 has a surface (e.g., a surface of the portion 155) which extends generally parallel to the portion 156. The portion 152 and the portion 156 generally define a region (e.g., a channel having a "C"-shaped cross-section or a "U"-shaped cross-section) therebetween through which air can flow to cool the module 20. In certain embodiments, at least a portion of the region through which air flows is spaced from the surface in a direction generally perpendicular to the surface. In certain embodiments, the region is generally symmetric about a center line extending along a length of the portion 156. In certain embodiments, the portion 155 is not generally planar but has one or more angles or curves which advantageously provide increased surface area for heat transfer away from the module 20. In certain embodiments, the portion 156 comprises one or more protrusions (e.g., louvers or fins) that generally extend away from the surface of the portion 156. In certain embodiments, the one or more protrusions advantageously enhance the heat removal from the module 20 by perturbing the air flow through the region and increasing the surface area for heat transfer away from the module 20.

In certain embodiments, the third segment 150 further comprises one or more supports configured to be mechanically coupled to the printed-circuit board 21 or to other portions of the heat spreader 110. In certain embodiments, the one or more supports comprise one or more recesses 158 configured to mate with corresponding protrusions of the other portions of the heat spreader 110. In certain embodiments, instead of recesses 158, the one or more supports comprise protrusions that mate with corresponding structures of the other portions of the heat spreader 110. The supports are configured to provide structural support, alignment, and/or locking for assembly of the third segment 150 on the module 20 with the other segments of the heat spreader 110. For example, at least some of the supports schematically illustrated in FIGS. 13A-13D comprise one or more tabs 159 configured to support the third segment 150 against a portion of the printed-circuit board 21 of the FBDIMM schematically illustrated in FIGS. 2A-2C.

Figure 14:
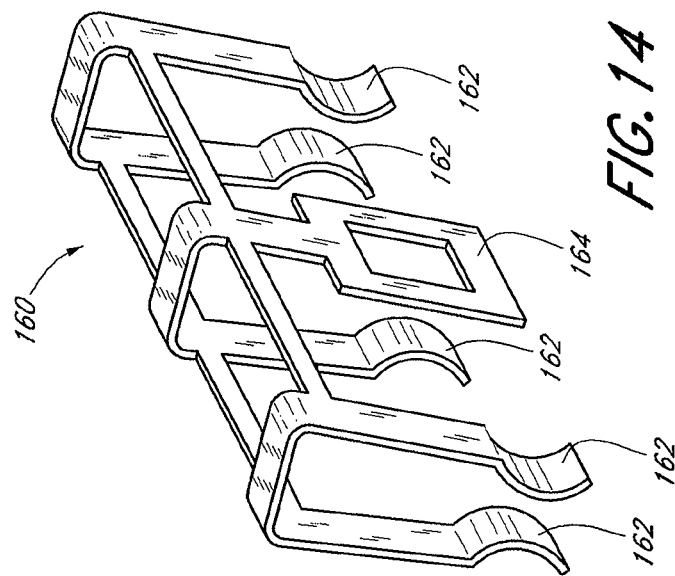
FIG. 14 schematically illustrates an example fastener compatible with certain embodiments described herein.

In certain embodiments, the first segment 130, the second segment 140, and the third segment 150 are held in place on the module 20 by one or more fasteners 160. FIG. 14 schematically illustrates an example fastener 160 compatible with certain embodiments described herein. The fastener 160 has a general "U"-cross-sectional shape which fits over respective portions of the first segment 130, the second segment 140, and the third segment 150. The fastener 160 provides a tension spring force which holds the first segment 130, the second segment 140, and the third segment 150 in place on either side 22, 26 of the module 20. In certain embodiments, the fastener 160 comprises one or more portions 162 that contact the first segment 130 and the third segment 150, and one or more portions 164 that contact the second segment 140. In certain embodiments, the fastener 160 comprises protrusions configured to mate with corresponding recesses on the first segment 130, the second segment 140, and the third segment 150, thereby advantageously increasing the stability of the heat spreader 110. In certain other embodiments, the fastener 160 comprises recesses which mate with corresponding protrusions on the first segment 130, the second segment 40, and the third segment 150. Other configurations of one or more fasteners 160 or other structures for holding the heat spreader 110 on the module 20 are also compatible with certain embodiments described herein.

Various embodiments of the present invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined by the appended claims.

What is claimed is:

1. A memory module having at least a first side, the memory module comprising:
   a plurality of integrated circuit packages on the first side, the plurality of integrated circuit packages comprising a first set of integrated circuit packages and a second set of one or more integrated circuit packages, wherein the first set of integrated circuit packages comprises a first plurality of dynamic random-access memory (DRAM) devices and the second set of one or more integrated circuit packages comprises an advanced memory buffer;

a first thermal conduit in thermal communication with the first set of integrated circuit packages and substantially thermally isolated from the second set of one or more integrated circuit packages;

a second thermal conduit in thermal communication with the second set of one or more integrated circuit packages; and a second side, a second plurality of dynamic random-access memory (DRAM) devices on the second side, and a thermally conductive material between and in thermal communication with the second thermal conduit and at least one DRAM device on the second side.

2. The memory module of claim 1, further comprising a third thermal conduit in thermal communication with at least one DRAM device of the plurality of DRAM devices on the second side.

3. The memory module of claim 2, further comprising a fastener that applies a force to the first thermal conduit, the second thermal conduit, and the third thermal conduit.

4. The memory module of claim 1, wherein at least one of the first thermal conduit and the second thermal conduit comprises a single unitary element.

5. The memory module of claim 1, wherein the second thermal conduit is substantially thermally isolated from the first thermal conduit.

6. The memory module of claim 1, wherein the first thermal conduit comprises a first portion in thermal communication with the first set of integrated circuit packages and a second portion having a surface extending generally parallel to the first portion, wherein the first portion and the second portion generally define a region therebetween through which air can flow.

7. The memory module of claim 6, wherein the first portion has a cutout to allow substantial thermal isolation between the first thermal conduit and the second set of one or more integrated circuit packages.

8. A memory module having at least a first side, the memory module comprising:
a plurality of integrated circuit packages on the first side, the plurality of integrated circuit packages comprising a first set of integrated circuit packages and a second set of one or more integrated circuit packages, wherein the first set of integrated circuit packages comprises a first plurality of dynamic random-access memory (DRAM) devices and the second set of one or more integrated circuit packages comprises an advanced memory buffer;
a first thermal conduit in thermal communication with the first set of integrated circuit packages and substantially thermally isolated from the second set of one or more integrated circuit packages; and
a second thermal conduit in thermal communication with the second set of one or more integrated circuit packages, wherein the first thermal conduit comprises a hole which substantially thermally isolates the first thermal conduit from the advanced memory buffer.

9. The memory module of claim 8, further comprising a thermally conductive material between and in thermal communication with the first thermal conduit and the first plurality of DRAM devices.

10. The memory module of claim 8, wherein at least one of the first thermal conduit and the second thermal conduit comprises a single unitary element.

11. The memory module of claim 8, wherein the first thermal conduit comprises a first portion in thermal communication with the first set of integrated circuit packages and wherein the hole is a cutout in the first portion.

12. The memory module of claim 11, wherein the first thermal conduit further comprises a second portion and wherein the second portion comprises one or more generally planar portions.

13. The memory module of claim 12, wherein the second portion comprises a surface extending generally parallel to the first portion, wherein the first portion and the second portion generally define a region therebetween through which air can flow.

14. The memory module of claim 11, wherein the second thermal conduit is substantially thermally isolated from the first thermal conduit.

15. The memory module of claim 8, further comprising a fastener configured to be mechanically coupled to the first thermal conduit and the second thermal conduit.

16. The memory module of claim 8, wherein at least one of the first thermal conduit and the second thermal conduit comprises a metal sheet, wherein at least one of the first thermal conduit and the second thermal conduit comprises:
a first portion in thermal communication with at least one of the plurality of integrated circuit packages on the first side; and
a second portion comprising a surface extending generally parallel to the first portion, wherein the first portion and the second portion generally define a region therebetween through which air can flow.

17. The memory module of claim 16, wherein the first portion is substantially flat.

18. The memory module of claim 16, wherein the second portion comprises one or more generally planar surfaces.

19. The memory module of claim 16, wherein the second portion comprises one or more angled or curved surfaces.

20. The memory module of claim 16, wherein the metal sheet is cut, bent, or both cut and bent.

21. The memory module of claim 16, wherein the region comprises a channel having a "C"-shaped cross-section.

22. The memory module of claim 16, wherein the region comprises a channel having a "U"-shaped cross-section.

23. The memory module of claim 16, wherein at least one of the first thermal conduit and the second thermal conduit is a single unitary sheet of material.

24. The memory module of claim 16, wherein the second thermal conduit is substantially thermally isolated from the first thermal conduit.

* * * * *